United States Patent
Sato

(10) Patent No.: US 8,737,142 B2
(45) Date of Patent: May 27, 2014

(54) INTERNAL VOLTAGE GENERATION CIRCUIT OF SEMICONDUCTOR MEMORY DEVICE, AND SEMICONDUCTOR MEMORY DEVICE

(71) Applicant: Fujitsu Semiconductor Limited, Yokohama (JP)

(72) Inventor: Takahiko Sato, Tachikawa (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/691,298

(22) Filed: Nov. 30, 2012

(65) Prior Publication Data

US 2013/0188432 A1    Jul. 25, 2013

(30) Foreign Application Priority Data

Jan. 19, 2012  (JP) .................................. 2012-008696

(51) Int. Cl.
*G11C 5/14*    (2006.01)

(52) U.S. Cl.
USPC .................................................. 365/189.09

(58) Field of Classification Search
USPC .................................................. 365/189.09
See application file for complete search history.

(56) References Cited

U.S. PATENT DOCUMENTS

| | | | |
|---|---|---|---|
| 5,568,419 A * | 10/1996 | Atsumi et al. | 365/185.3 |
| 5,621,348 A | 4/1997 | Furutani et al. | |
| 5,757,228 A | 5/1998 | Furutani et al. | |
| 5,796,287 A | 8/1998 | Furutani et al. | |
| 5,999,475 A * | 12/1999 | Futatsuya et al. | 365/226 |
| 6,809,560 B1 * | 10/2004 | Wrathall | 327/108 |
| 7,853,226 B2 * | 12/2010 | Hirata et al. | 455/226.2 |
| 2009/0267684 A1 | 10/2009 | Do | |
| 2010/0271115 A1 | 10/2010 | Do | |
| 2012/0032734 A1 | 2/2012 | Do | |
| 2013/0169247 A1 * | 7/2013 | Onouchi et al. | 323/269 |

FOREIGN PATENT DOCUMENTS

| | | |
|---|---|---|
| JP | 6-204847 A | 7/1994 |
| JP | 2009-268091 A | 11/2009 |

* cited by examiner

*Primary Examiner* — Huan Hoang
*Assistant Examiner* — Pablo Huerta
(74) *Attorney, Agent, or Firm* — Arent Fox LLP

(57) ABSTRACT

An internal voltage generation circuit includes a vblh voltage generation circuit that generates a voltage vblh that is supplied as a high-voltage power supply of a sense amplifier, and a voltage distribution control circuit that has a first current source that pulls down an output node and a second current source that pulls up the output node. The output node is pulled down by the first current source operating, and the voltage thereof is maintained at a voltage that corresponds to a lower limit of a detection voltage value. The output node is pulled up by the second current source operating, and the voltage thereof is maintained at a voltage that corresponds to an upper limit of the detection voltage value.

15 Claims, 15 Drawing Sheets

F I G. 16A
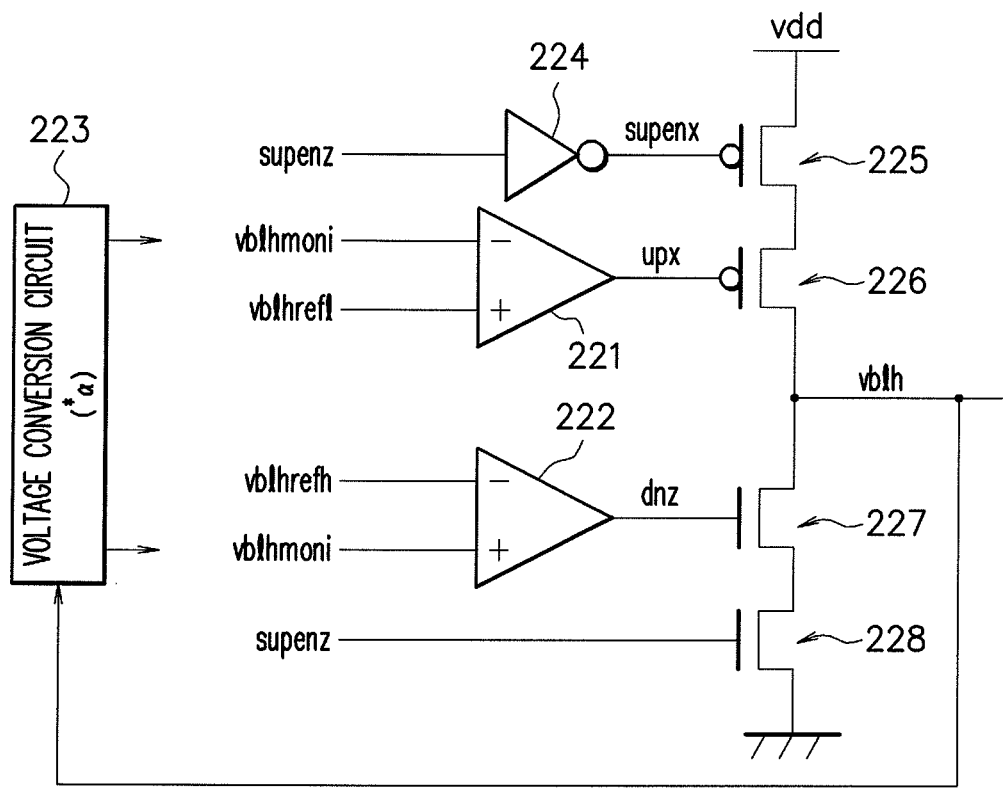
F I G. 16B
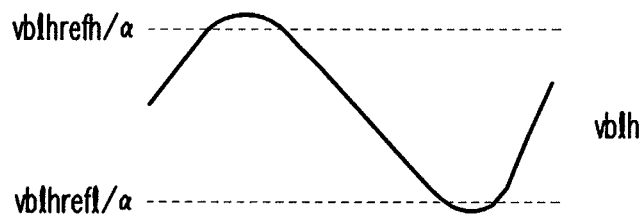

F I G. 20
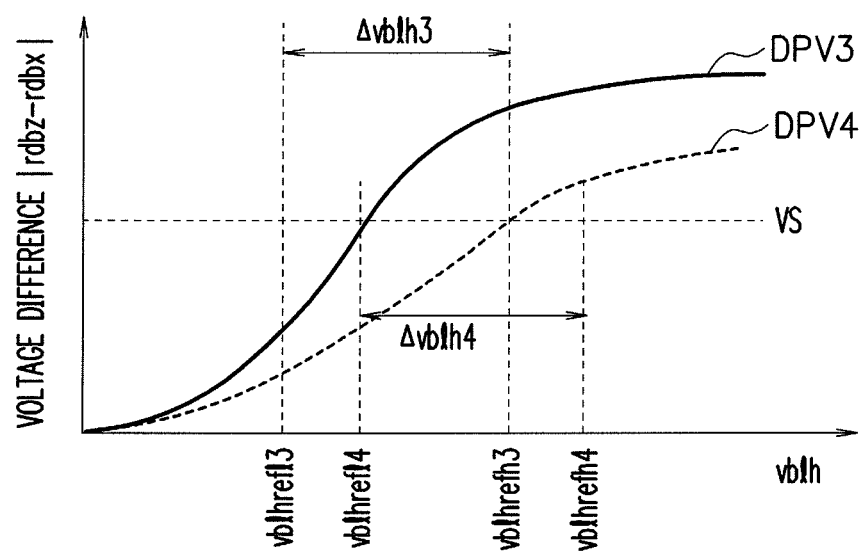

US 8,737,142 B2

INTERNAL VOLTAGE GENERATION CIRCUIT OF SEMICONDUCTOR MEMORY DEVICE, AND SEMICONDUCTOR MEMORY DEVICE

CROSS-REFERENCE TO RELATED APPLICATION

This application is based upon and claims the benefit of priority of the prior Japanese Patent Application No. 2012-008696, filed on Jan. 19, 2012, the entire contents of which are incorporated herein by reference.

FIELD

The present embodiment relates to internal voltage control technology for a semiconductor memory device in which an internal voltage generation circuit is mounted.

BACKGROUND

A semiconductor memory device includes memory cells for storing information and switching elements for updating memory information. Reading of information stored in a semiconductor memory device is influenced by the initial storage state when writing and the state when reading and the like. For example, a dynamic random access memory (DRAM) stores a voltage value in a memory cell capacitor as memory information. There is leakage current in a memory cell capacitor or a transistor that serves as a switching element of a DRAM, and hence if the DRAM is unused for a long time period it will not be possible to read out the same information as the information at the time of writing. Therefore, in the case of a DRAM, information stored in memory cells is updated by periodic refresh operations. The amount of time for which information stored in a memory cell can be maintained depends on various factors. The power supply voltage value when writing the information is one such factor.

For example, a semiconductor memory device with a one-gigabit memory capacity has approximately one billion memory cells in a chip, and there are variations in the data retention characteristics of the respective memory cells. In general, in a semiconductor memory device, redundancy repair is performed in which memory cells that do not meet specification performance requirements are replaced with other memory cells that meet the specification performance requirements.

Patent Document 1 discusses technology that corresponds to the clock frequency dependence of a consumption current request in which a circuit that performs analog control of an output voltage by performing a voltage comparison with a reference voltage value, and a circuit that performs digital control of an output voltage in synchrony with a clock signal that acts as a trigger for a memory access command are mounted on a semiconductor memory device chip. Further, Patent Document 2 discusses technology that, with respect to a power supply for a data output circuit, supplies a high voltage that exceeds a power supply voltage.

[Patent Document 1] Japanese Laid-open Patent Publication No. 2009-268091
[Patent Document 2] Japanese Laid-open Patent Publication No. 6-204847

To appropriately perform redundancy repair for a semiconductor memory device, it is performed to detect memory cells that do not meet specification performance requirements with favorable reproducibility, and thus voltage values and the like can be accurately set in tests performed for that purpose.

SUMMARY

One aspect of an internal voltage generation circuit of a semiconductor memory device includes: a voltage generation circuit that generates a second power supply voltage based on a first power supply voltage that is supplied and outputs the second power supply voltage to an output node, and also compares a voltage of the output node and a detection voltage value and controls the voltage of the output node so as to be between voltages that correspond to a lower limit and an upper limit of the detection voltage value, respectively; and a voltage control circuit that includes a first current load circuit that changes the voltage of the output node so as to pull down the voltage of the output node and a second current load circuit that changes the voltage of the output node so as to pull up the voltage of the output node. The voltage of the output node is maintained at a voltage corresponding to the lower limit of the detection voltage value by the first current load circuit operating, and the voltage of the output node is maintained at a voltage corresponding to the upper limit of the detection voltage value by the second current load circuit operating.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 16A is a view that illustrates a configuration example of a vblh voltage generation circuit;

FIG. 16B is a view that illustrates an example of a voltage vblh generated by the circuit illustrated in FIG. 16A;

FIG. 20 is a view that illustrates a voltage vblh and a voltage difference between read buses in a semiconductor memory device in a case of applying the circuit illustrated in FIG. 16A.

DESCRIPTION OF EMBODIMENTS

An embodiment is described hereunder based on the drawings. Note that in the following description, a high level of a signal is also denoted by "H", and a low level of a signal is also denoted by "L". Further, a signal having a signal name suffixed with a letter "z" indicates a positive logic. A signal having a signal name suffixed with a letter "x" indicates a negative logic. In addition, a signal having a signal name prefixed with a symbol "/" indicates a negative logic.

Figure 15:
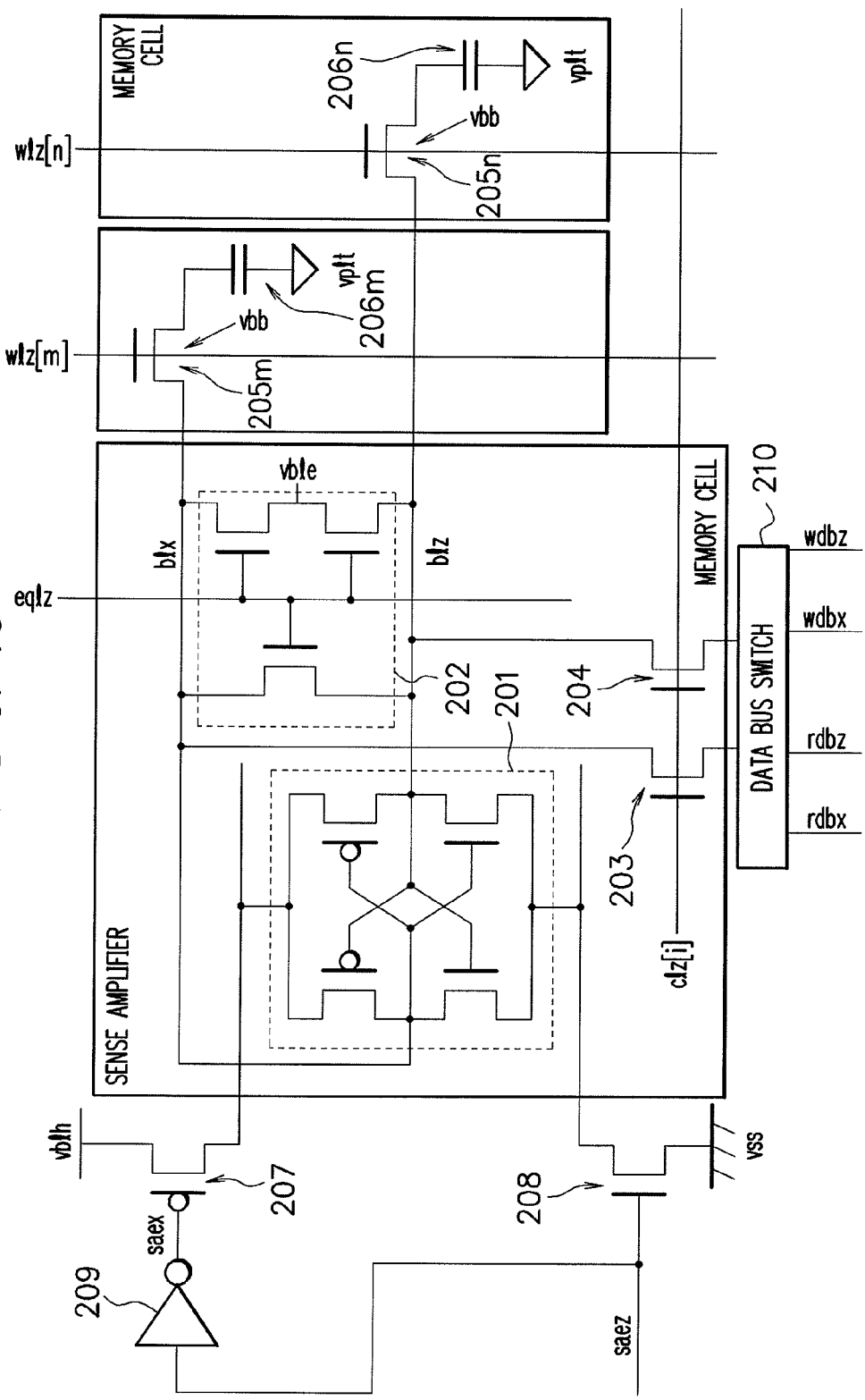
FIG. 15 is a view that illustrates a configuration example of a memory core of a semiconductor memory device (DRAM)

First, reference technology that leads to the present embodiment will be described. FIG. 15 is a view that illustrates a configuration example of a memory core of a semiconductor memory device (DRAM) as reference technology. Each memory cell of the memory core has a cell transistor 205 and a memory cell capacitor 206. The cell transistor 205 is a component for controlling charging and discharging with respect to the memory cell capacitor 206. In the cell transistor 205, a drain is connected to one electrode of the memory cell capacitor 206, a gate is connected to a word line w/z, and a source is connected to a bit line blz or blx. A voltage vbb is supplied to a back gate of the cell transistor 205. The memory cell capacitor 206 is a component for storing information, and a plate voltage vplt is supplied to the other electrode thereof.

The bit lines blz and blx are data lines that are connected in a complementary manner to a sense amplifier. The sense amplifier includes an amplification part 201, an equalizer circuit 202, and column switches 203 and 204. When reading or writing of data from or to a memory cell is not being performed, the bit lines blz and blx are reset to a voltage vble that is an initialization voltage by a control signal eqlz. When reading data, by activating activation signals saez and saex of the sense amplifier after the word line w/z becomes "H" and the memory cell is connected to the bit lines blz and blx in accordance with an access address, the data that is read from the memory cell is amplified by the amplification part 201. The data that has been amplified by the amplification part 201 is written back into the memory cell capacitor 206 through the bit lines blz and blx.

The activation signal saez of the sense amplifier is supplied to the gate of a transistor 208, and the signal saex that is obtained by inverting the signal saez at an inverter 209 is supplied to the gate of a transistor 207. Accordingly, as a result of the activation signal saez being activated, a voltage vblh as a high-voltage power supply and a voltage vss as a low-voltage power supply are supplied to the amplification part 201 of the sense amplifier. The voltage vblh stores "H" information in the memory cell capacitor 206, that is, information that corresponds to a power supply when writing.

Data that is read from the memory cell becomes a voltage that is based on the voltage vble. When reading "H" data from a memory cell connected to the bit line blz, the voltage of the bit line blz becomes a higher voltage than the voltage vble, and the fact that the potential of the bit line blz is high compared to the potential of the bit line blx is detected by the sense amplifier and an operation to amplify and read the data is performed. Operations are performed in a similar manner when reading "L" data from the memory cell or when the connected bit line is the bit line blx.

When writing information to the memory cell, a column select line clz is activated and write data buses wdbz/wdbx are connected to the bit lines blz/blx through the column switches 203 and 204 and a data bus switch 210 to update the information of the memory cell. Further, when reading information stored in the memory cell, the column select line clz is activated and read data buses rdbz/rdbx are connected to the bit lines blz/blx through the column switches 203 and 204 and the data bus switch 210. The write data buses wdbz/wdbx and the read data buses rdbz/rdbx are buses for performing data read and write operations with respect to outside of the memory cell, and are data buses that are disposed further on an input/output terminal side than the memory core.

FIG. 16A is view that illustrates a configuration example of a vblh voltage generation circuit that generates the voltage vblh that is supplied as a high-voltage power supply to the sense amplifier. As illustrated in FIG. 16A, the vblh voltage generation circuit includes a pull-up-driver driving amplifier 221, a pull-down-driver driving amplifier 222, a voltage conversion circuit 223, an inverter 224, a pull-up driver 226, a pull-down driver 227, and transistors 225 and 228. Because a large number of memory cells of a memory cell array are driven at one time by the sense amplifier, the voltage vblh is liable to fluctuate. Therefore, in order to correspond to a large peak current, the voltage vblh drives the pull-up driver 226 and the pull-down driver 227 with the amplifiers 221 and 222, respectively.

The pull-up-driver driving amplifier 221 takes a value vblhrefl that corresponds to a lower limit of a voltage to be output with the voltage vblh as a reference voltage, performs a comparison of the reference voltage with a detection voltage vblhmoni obtained by subjecting the voltage vblh to voltage conversion. And the driving amplifier 221 drives the pull-up driver 226 based on a comparison result. The pull-down-driver driving amplifier 222 takes a value vblhrefh that corresponds to an upper limit of a voltage to be output with the voltage vblh as a reference voltage, performs a comparison of the reference voltage with the detection voltage vblhmoni obtained by subjecting the voltage vblh to voltage conversion. And the driving amplifier 222 drives the pull-down driver 227 based on a comparison result.

When a voltage conversion ratio of the voltage conversion circuit 223 is taken as "α", vblhmoni=vblh×α. As illustrated in FIG. 16B, an upper limit value of the generated voltage vblh is vblhrefh/α, and a lower limit value of the voltage vblh is vblhrefl/α. Further, a signal supenz is input as a signal that logically controls activation of the drivers 226 and 227. When the signal supenz is "L", the drivers 226 and 227 are stopped to stop the current supply to the vblh voltage generation circuit. The signal supenz is utilized to reduce the current at standby, and can be used for adjusting the current supply capacity by controlling the number of circuits that activate the drivers 226 and 227 when a plurality of the vblh voltage generation circuits are disposed in a chip.

Figure 17A:
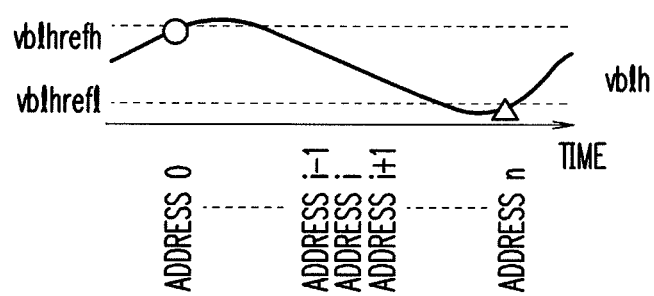
FIGS. 17A and 17B are views for explaining the influence of variations in a voltage vblh generated by the circuit illustrated in FIG. 16A.
Figure 17B:
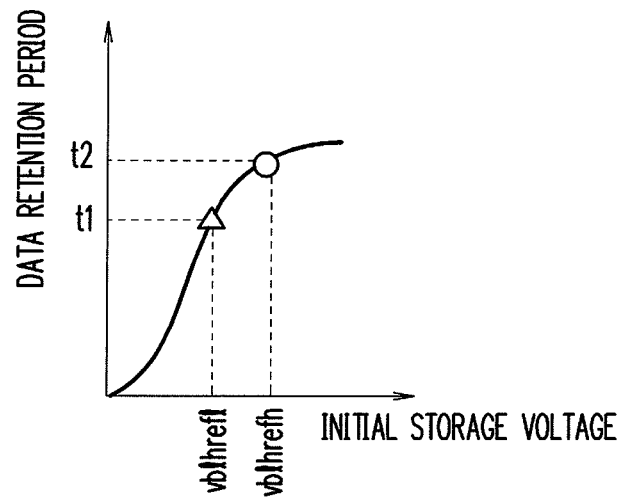

FIGS. 17A and 17B are views for explaining the influence of variations in the voltage vblh generated by the circuit illustrated in FIG. 16A. In FIGS. 17A and 17B, to facilitate the explanation, it is assumed that the voltage conversion ratio α of the voltage conversion circuit 223 is 1.0. When the voltage generation circuit illustrated in FIG. 16A is utilized as a power supply for "H" data to be stored in memory cells, as illustrated in FIG. 17B, an influence on the data retention characteristics arises with respect to data written with the voltage vblhrefh and data written with the voltage vblhrefl. That is, the data retention periods of the memory cells are influenced by fluctuations in the voltage vblh generated by the vblh voltage generation circuit.

For example, when accesses are made in a sequential order to each memory cell of the memory core while changing the storage location, it is assumed that the voltage vblh changes as illustrated in FIG. 17A. At this time, the situation corresponds to one in which information is stored with voltages of different states with respect to an address 0 storage location in which data has been written with the voltage vblhrefh and an address n storage location in which data has been written with the voltage vblhrefl. In a case where the data retention characteristics of the memory cells at the address 0 storage location and the address n storage location are the same when data is written into the memory cells under the same conditions, the data retention characteristics of the memory cell at the address 0 storage location in which data has been written with the voltage vblhrefh appear superior to the data retention characteristics of the memory cell at the address n storage location in which data has been written with the voltage vblhrefl.

However, for example, when the sequence in which the addresses are accessed is reversed, it is not possible to expect that data will be written with the voltage vblhrefh in the memory cell at the address 0 storage location. Even if the addresses are accessed in sequential order once again in the same manner from the address 0 storage location, there is the possibility that data will not be written with the voltage vblhrefh in the memory cell at the address 0 storage location. Hence, for example, even if the data retention characteristics of the memory cell at the address 0 storage location with respect to data that is written with the voltage vblhrefh are checked by performing a test or the like, it is unclear whether or not the data retention characteristics of the relevant memory cell meet the requirements regarding the required data retention characteristics in a case where data is written with the voltage vblhrefl in the relevant memory cell.

Figure 18:
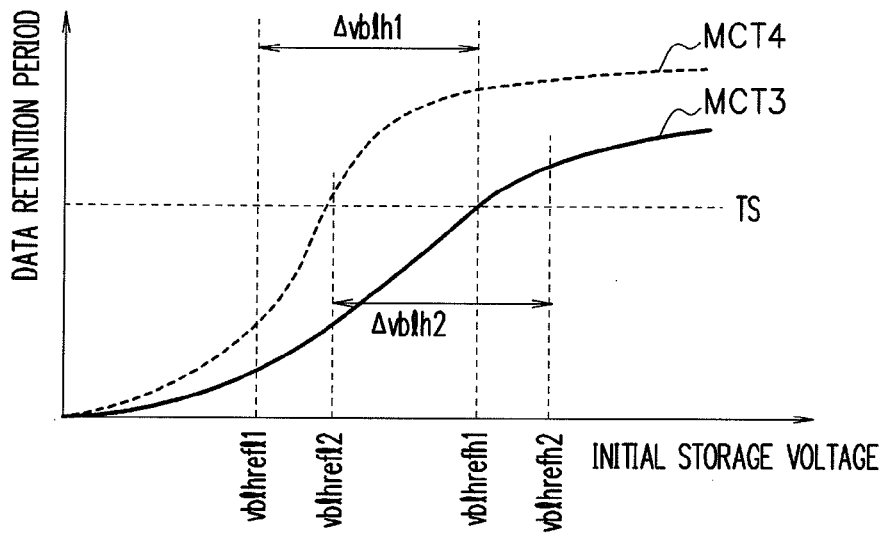
FIG. 18 is a view that illustrates an example of an initial storage voltage and a data retention period in a semiconductor memory device in a case of applying the circuit illustrated in FIG. 16A.

FIG. 18 is a view that illustrates an example of an initial storage voltage and a data retention period in a semiconductor memory device in a case of applying the circuit illustrated in FIG. 16A. In FIG. 18, reference character MCT3 denotes characteristics of a memory cell with poor characteristics (characteristics that do not meet specification performance requirements), reference character MCT4 denotes characteristics of a memory cell with normal characteristics (characteristics that meet specification performance requirements), and reference character TS denotes a needed data retention period. When the data retention period is shorter than TS, the relevant memory cell does not meet the specification performance requirements. Two kinds of settings are illustrated in FIG. 18 as the ranges of a voltage that is output from the vblh voltage generation circuit.

In FIG. 18, a variation in the outputted voltage vblh is denoted by Δvblhl, with a lower limit value of the voltage vblh being denoted by vblhrefl1 and an upper limit value of the voltage vblh being denoted by vblhrefh1. In this case, although a memory cell with poor characteristics as illustrated by the characteristics MCT3 will definitely be detected as a defective memory cell, in some cases a memory cell with normal characteristics as illustrated by the characteristics MCT4 will also be judged to be a defective memory cell. For example, even when the voltage vblh is output at a high level and is in the vicinity of the voltage vblhrefh1, because the memory cell with poor characteristics (characteristics MCT3) does not meet the requirement for a data retention period, the memory cell will definitely be detected as a defective memory cell. However, when the voltage vblh falls as far as the vicinity of vblhrefl1 that is the lower limit value, a memory cell with normal characteristics (characteristics MCT4) will also be detected as a defective memory cell since it is not possible for the memory cell with normal characteristics to meet the requirements for the data retention period. Consequently, in this case, although a problem does not arise after shipment, the yield decreases at the time of production and thus leads to an increase in costs.

Further, in FIG. 18, a variation in the outputted voltage vblh is denoted by Δvblh2, with a lower limit value of the voltage vblh being denoted by vblhrefl2 and an upper limit value of the voltage vblh being denoted by vblhrefh2. In this case, although a memory cell with normal characteristics as illustrated by the characteristics MCT4 will be detected as a non-defective memory cell, in some cases it is not possible to detect a memory cell with poor characteristics as illustrated by the characteristics MCT3 as a defective memory cell. For example, even when the voltage vblh is output at a low level and is in the vicinity of the voltage vblhrefl2, the memory cell with normal characteristics (characteristics MCT4) meets the requirement for a data retention period and is not detected as a defective memory cell. However, when the voltage vblh rises to the vicinity of vblhrefh2 that is the upper limit value, it is not possible to detect the memory cell with poor characteristics (characteristics MCT3) as a defective memory cell. Consequently, since it is not possible to replace the memory cell in question with a memory cell with normal characteristics by a redundancy repair operation, it is not possible for the memory cell to meet the requirements for a data retention period when the voltage vblh, for example, falls to the vicinity of the voltage vblhrefl2. There is thus a risk that a problem will arise after shipment.

Figure 19:
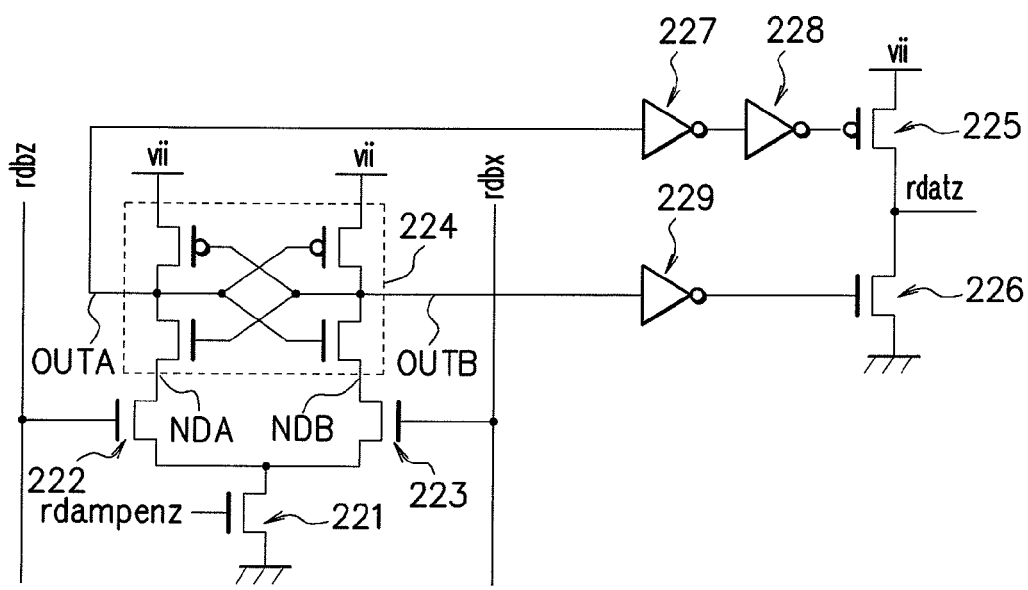
FIG. 19 is a view that illustrates a configuration example of a data read amplifier.

FIG. 19 is a view that illustrates a configuration example of a data read amplifier of the semiconductor memory device. For example, with respect to the read data buses rdbz and rdbx to which data is output through the data bus switch from the memory core illustrated in FIG. 15, information is transmitted with a small amplitude in a state in which the voltage of a data bus on the "H" side is vblh and the voltage of a data bus on the "L" side is (vblh−ΔV). For example, when storing "H" information, the voltage of the read data bus rdbz is vblh and the voltage of the read data bus rdbx is (vblh−ΔV). When storing "L" information, the voltage of the read data bus rdbz is (vblh−ΔV) and the voltage of the read data bus rdbx is vblh.

The read amplifier has a differential configuration. The read data buses rdbz and rdbx are connected to the gates of transistors 222 and 223, respectively. A difference in potential between nodes NDA and NDB in accordance with the voltages of the transistors 222 and 223 is amplified by an amplification part 224. The voltage of a node OUTA is supplied to the gate of a transistor 225 through inverters 227 and 228. The voltage of a node OUTB is supplied to the gate of a transistor 226 through an inverter 229. Thus, the voltages of the read data buses rdbz and rdbx are converted to a signal with an amplitude of a voltage (vii−vss) and output as a signal rdatz. In this case, with respect to the voltage detection of the amplifier, an input common voltage is the voltage vblh, and if an amplitude according to the differential voltage ΔV becomes small compared to the voltage vblh, a difference between a gate-to-source voltage Vgs of the transistors decreases and the differential voltage between the read data buses rdbz and rdbx becomes a problem. This becomes more noticeable if the voltage vii decreases and the gate-to-source voltage Vgs of the transistors decreases.

FIG. 20 is a view that illustrates the voltage vblh and a voltage difference between read buses that is required for a normal reading operation in the semiconductor memory device in a case of applying the circuit illustrated in FIG. 16A. In FIG. 20, reference character DPV3 denotes characteristics of a data transmission path with poor characteristics (characteristics that do not meet specification performance requirements), reference character DPV4 denotes characteristics of a data transmission path with normal characteristics (characteristics that meet specification performance requirements), and reference character VS denotes a needed differential voltage between the read data buses rdbz and rdbx. When a differential voltage between the read data buses rdbz and rdbx that is needed at the time of a normal reading operation is greater than VS, the performance is insufficient. Two kinds of settings are illustrated in FIG. 20 as ranges of a voltage output from the vblh voltage generation circuit.

Here, with regard to the data transmission path with poor characteristics, a case is assumed in which, for example, there is an offset with respect to the characteristics of the amplification part 224 in the amplifier and detection characteristics for a differential voltage are poor, or there are variations in the detection speed due to the influence of variations in the characteristics of a transistor 221 that is controlled by a signal rdampenz or the like. Further, a case can be similarly considered in which it is difficult for a differential voltage to arise between the read data buses rdbz and rdbx due to the connection state between the bit lines blz and blx and the read data buses rdbz and rdbx that is illustrated in FIG. 15 or a parasitic capacity or the like.

In FIG. 20, a variation in the outputted voltage vblh is denoted by Δvblh3, with a lower limit value of the voltage vblh being denoted by vblhrefl3 and an upper limit value of the voltage vblh being denoted by vblhrefh3. In this case, although a data transmission path with normal characteristics as illustrated by the characteristics DPV4 can be detected as a non-defective data transmission path, it is not possible to detect a data transmission path with poor characteristics as illustrated by the characteristics DPV3 as a defective data transmission path. For example, since the normal data transmission path (characteristics DPV4) is not detected as a defective data transmission path when a normal read operation is performed even when the voltage vblh rises to the voltage vblhrefh3, the yield at the time of production can be increased and costs can be lowered. However, when the voltage vblh falls to the vicinity of vblhrefl3 that is the lower limit value, since a normal read operation is also performed with respect to the data transmission path with poor characteristics (characteristics DPV3), it is not possible to detect the data transmission path with poor characteristics (characteristics DPV3) as a defective data transmission path. When replacement of a memory cell relating to this data transmission path with a memory cell relating to a normal data transmission path is not performed by a redundancy repair operation, for example, if the voltage vblh rises as far as the vicinity of the voltage vblhrefh3, it is not possible for the data transmission path to meet the data transmission path specifications and there is thus a risk that a problem will arise after shipment.

Further, in FIG. 20, a variation in the voltage vblh is denoted by Δvblh4, with a lower limit value of the voltage vblh being denoted by vblhrefl4 and an upper limit value of the voltage vblh being denoted by vblhrefh4. In this case, since the data transmission path with poor characteristics as illustrated by the characteristics DPV3 does not meet a requirement regarding differential voltage between the read data buses rdbz and rdbx that is needed for a normal readout operation, the data transmission path with poor characteristics can be definitely detected as a defective data transmission path even if the voltage vblh falls as far as the voltage vblhrefl4. For example, even if the voltage vblh falls as far as the vicinity of the voltage vblhrefl4, since the size of a differential voltage between the read data buses rdbz and rdbx does not meet the requirement for a specified size, the data transmission path with poor characteristics as illustrated by the characteristics DPV3 is detected as a defective data transmission path. However, when the voltage vblh falls as far as the vicinity of vblhrefl4 that is the lower limit value, it is not possible for a requirement regarding the size of a differential voltage between the read data buses rdbz and rdbx to be met by the data transmission path with normal characteristics (characteristics DPV4) either, and therefore the data transmission path with normal characteristics (characteristics DPV4) is detected as a defective data transmission path. Consequently, in this case, although a problem does not arise after shipment, the yield declines at the time of production and this leads to an increase in costs.

Figure 1:
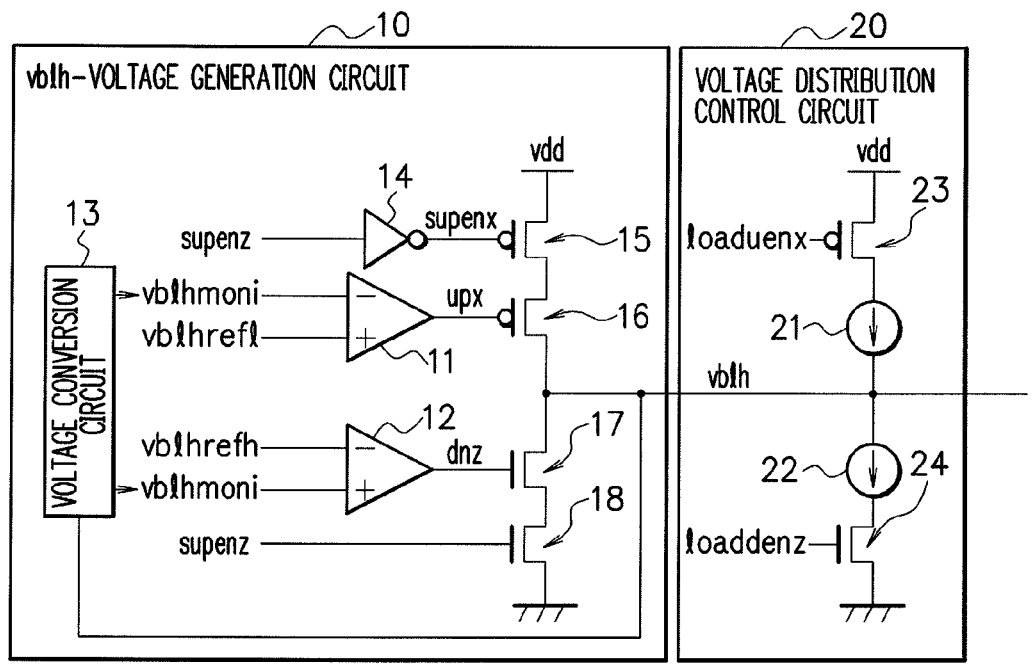
FIG. 1 is a view that illustrates a configuration example of a vblh voltage generation circuit and a voltage distribution control circuit according to an embodiment.

An embodiment is described hereunder. FIG. 1 is a view that illustrates a configuration example of a vblh voltage generation circuit and a voltage distribution control circuit according to the present embodiment. A vblh voltage generation circuit 10 is configured in the same manner as the vblh voltage generation circuit illustrated in FIG. 16A, and generates a voltage vblh that is supplied as a high-voltage power supply of a sense amplifier. The vblh voltage generation circuit 10 includes a pull-up-driver driving amplifier 11, a pull-down-driver driving amplifier 12, a voltage conversion circuit 13, an inverter 14, a pMOS transistor 15, a pull-up driver 16, a pull-down driver 17, and an nMOS transistor 18. The pull-up driver 16 is, for example, a pMOS transistor. The pull-down driver 17 is, for example, an nMOS transistor.

A lower limit value vblhrefl of a detection voltage and a detection voltage vblhmoni obtained by subjecting the voltage vblh to voltage conversion are input to the pull-up-driver driving amplifier 11. The pull-up-driver driving amplifier 11 supplies a signal upx that is the result of a comparison between the voltage vblhmoni and the voltage vblhrefl to a gate of the pull-up driver 16. That is, the pull-up-driver driving amplifier 11 takes vblhrefl that corresponds to the lower limit of a voltage to be output with the voltage vblh as a reference voltage, compares vblhrefl with the detection voltage vblhmoni obtained by subjecting the voltage vblh to voltage conversion, and drives the pull-up driver 16.

Further, an upper limit value vblhrefh of the detection voltage and the detection voltage vblhmoni obtained by subjecting the voltage vblh to voltage conversion are input to the pull-down-driver driving amplifier 12. The pull-down-driver driving amplifier 12 supplies a signal dnz that is the result of a comparison between the voltage vblhmoni and the voltage vblhrefh to a gate of the pull-down driver 17. That is, the pull-down-driver driving amplifier 12 takes vblhrefh that corresponds to the upper limit of a voltage to be output with the voltage vblh as a reference voltage, compares vblhrefh with the detection voltage vblhmoni obtained by subjecting the voltage vblh to voltage conversion, and drives the pull-down driver 17.

The voltage conversion circuit 13 outputs the detection voltage vblhmoni obtained by subjecting the voltage at an output node of the voltage vblh to voltage conversion at a voltage conversion ratio to the driving amplifiers 11 and 12. In the following description, to facilitate the description, it is assumed that the voltage conversion ratio of the voltage conversion circuit 13 is 1.0, however the voltage conversion ratio is not limited thereto, and it is possible to set the voltage conversion ratio of the voltage conversion circuit 13 to an arbitrary value.

In the pull-up driver 16, a source is connected to a voltage vdd that is a high-voltage power supply through the transistor 15, and a drain is connected to the output node of the voltage vblh. In the pull-down driver 17, a source is connected to a voltage vss that is a low-voltage power supply through the transistor 18, and a drain is connected to the output node of the voltage vblh. A signal supenx obtained by inverting a signal supenz by the inverter 14 is supplied to the gate of the transistor 15, and the signal supenz is supplied to the gate of the transistor 18. The signal supenz logically controls activation of the pull-up driver 16 and the pull-down driver 17.

When the signal supenz is "L", the pull-up driver 16 and the pull-down driver 17 are stopped to stop the current supply to the vblh voltage generation circuit 10. When the signal supenz is "H" and the signal upx is "L", that is, when the detection voltage vblhmoni is lower than the lower limit value vblhrefl, the voltage vblh of the output node is pulled up by the pull-up driver 16 and rises. In contrast, when the signal supenz is "H" and the signal dnz is "H", that is, when the detection voltage vblhmoni is higher than the upper limit value vblhrefh, the voltage vblh of the output node is pulled down by the pull-down driver 17 and falls.

The voltage distribution control circuit 20 changes the voltage vblh of the output node so as to pull up the voltage vblh to the upper limit or pull down the voltage vblh to the lower limit. The voltage distribution control circuit 20 has current sources 21 and 22, a pMOS transistor 23, and an nMOS transistor 24. The current source 21 as a current load is connected to the output node of the voltage vblh and is also connected to the voltage vdd that is a high-voltage power supply through the transistor 23. The current source 22 as a current load is connected to the output node of the voltage vblh and is also connected to the voltage vss that is a low-voltage power supply through the transistor 24. A signal loaduenx is supplied to the gate of the transistor 23. A signal loaddenz is supplied to the gate of the transistor 24. The signal loaduenx controls activation of the current source 21. The signal loaddenz controls activation of the current source 22.

When the signal loaduenx is "L", the output node of the voltage vblh is pulled up. Further, when the detection voltage vblhmoni that is output by the voltage conversion circuit 13 reaches the upper limit value vblhrefh, the supply current of the pull-down driver 17 of the vblh voltage generation circuit 10 and the current consumption of the voltage distribution control circuit 20 become equal. As a result, the voltage vblh of the output node stops rising, and a voltage vblh that corresponds to the upper limit value vblhrefh is output from the output node. Since a current supply capacity of an output driver of the vblh voltage generation circuit 10 exhibits a nonlinear characteristic, the current supply capacity is adjusted by the detection voltage vblhmoni becoming equal to the upper limit value vblhrefh at a time point at which a current load of a constant current is reached.

Further, when the signal loaddenz becomes "H", the output node of the voltage vblh is pulled down. Further, when the detection voltage vblhmoni that is output by the voltage conversion circuit 13 reaches the lower limit value vblhrefl, the supply current of the pull-up driver 16 of the vblh voltage generation circuit 10 and the current consumption of the voltage distribution control circuit 20 become equal. As a result, the voltage vblh of the output node stops falling, and a voltage vblh that corresponds to the lower limit value vblhrefl is output from the output node. Since a current supply capacity of the output driver of the vblh voltage generation circuit 10 exhibits a nonlinear characteristic, the current supply capacity is adjusted by the detection voltage vblhmoni becoming equal to the lower limit value vblhrefl at a time point at which a current load of a constant current is reached.

Figure 2:
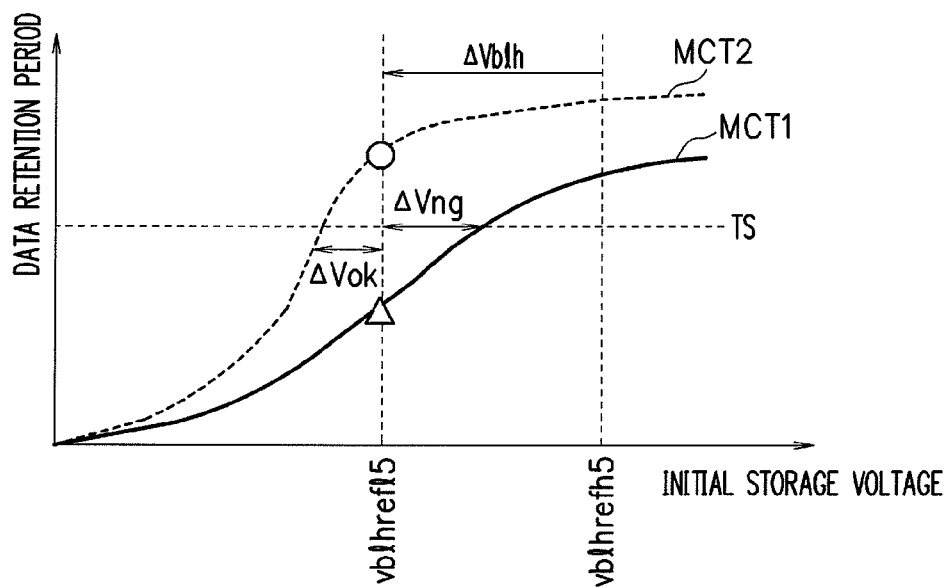
FIG. 2 is a view that illustrates an example of an initial storage voltage and a data retention period in a semiconductor memory device in a case of applying the circuit illustrated in FIG. 1.

FIG. 2 is a view that illustrates an example of an initial storage voltage and a data retention period in a semiconductor memory device in a case of applying the circuit illustrated in FIG. 1. In FIG. 2, reference character MCT1 denotes characteristics of a memory cell with poor characteristics (characteristics that do not meet specification performance requirements), reference character MCT2 denotes characteristics of a memory cell with normal characteristics (characteristics that meet specification performance requirements), and reference character TS denotes a needed data retention period. When the data retention period is shorter than TS, the memory cell does not meet the specification performance requirements. In a state in which the voltage distribution control circuit 20 is not actuated, a variation in the voltage vblh output from the vblh voltage generation circuit 10 is Δvblh, a lower limit value of the voltage vblh is vblhrefl5, and an upper limit value of the voltage vblh is vblhrefh5.

For example, when performing detection of memory cells with poor characteristics in which control of the voltage vblh by the voltage distribution control circuit 20 is applied in write operations of the semiconductor memory device, the voltage vblh is controlled to a low side of a voltage at which a worst state is entered at a time of normal operation. At such time, by making the signal loaddenz "H" to activate the current source 22 of the voltage distribution control circuit 20, the voltage vblh of the output node is set to vblhrefl5 that is the lower limit value. In this manner, detection of memory cells with poor characteristics is performed by setting a voltage for writing to the memory cells to a low value and performing write operations in a state in which the data retention characteristics are assumed to be poorest in normal operation. In this case, for example, even if the voltage vblh of the output node has varied higher by ΔVng due to noise or the like, a memory cell with poor characteristics can be detected as a defective memory cell, and the occurrence of a problem after shipping can be prevented. Further, for example, even if the voltage vblh of the output node has varied lower by ΔVok due to noise or the like, a memory cell with normal characteristics is not detected as a defective memory cell and therefore the yield does not decrease.

Figure 3:
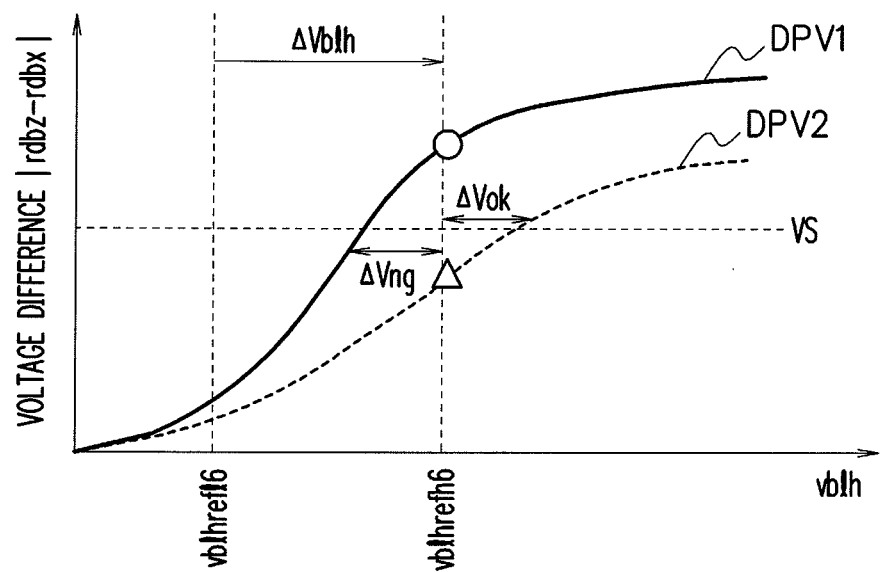
FIG. 3 is a view that illustrates a voltage vblh and a voltage difference between read buses in a semiconductor memory device in a case of applying the circuit illustrated in FIG. 1.

FIG. 3 is a view that illustrates the voltage vblh and a voltage difference between read buses in a semiconductor memory device in a case of applying the circuit illustrated in FIG. 1. In FIG. 3, reference character DPV1 denotes characteristics of a data transmission path with poor characteristics (characteristics that do not meet specification performance requirements), reference character DPV2 denotes characteristics of a data transmission path with normal characteristics (characteristics that meet specification performance requirements), and reference character VS denotes a needed differential voltage between the read data buses rdbz and rdbx. When the differential voltage between the read data buses rdbz and rdbx is greater than VS, the performance of the relevant data transmission path is insufficient. In a state in which the voltage distribution control circuit 20 is not actuated, a variation in the voltage vblh output from the vblh voltage generation circuit 10 is Δvblh, a lower limit value of the voltage vblh is vblhrefl6, and an upper limit value of the voltage vblh is vblhrefh6.

For example, when performing detection of data transmission paths with poor characteristics to which control of the voltage vblh by the voltage distribution control circuit 20 is applied in read operations of the semiconductor memory device, the voltage vblh is controlled to a high side of a voltage at which a worst state is entered at a time of normal operation. At such time, by making the signal loaduenx "L" to activate the current source 21 of the voltage distribution control circuit 20, the voltage vblh of the output node is set to vblhrefh6 that is the upper limit value. In this manner, detection of data transmission paths with poor characteristics is performed by setting the voltage vblh to a high value and performing read operations in a state in which performance is assumed to be poorest in normal operation. In this case, for example, even if the voltage vblh of the output node has varied lower by ΔVng due to noise or the like, a data transmission path with poor characteristics can be detected as a defective data transmission path, and the occurrence of a problem after shipping can be prevented. Further, for example, even if the voltage vblh of the output node has varied higher by ΔVok due to noise or the like, a data transmission path with normal characteristics is not detected as a defective data transmission path and therefore the yield does not decrease.

Next, generation of the signal loaduenx and the signal loaddenz is described.

Figure 4:
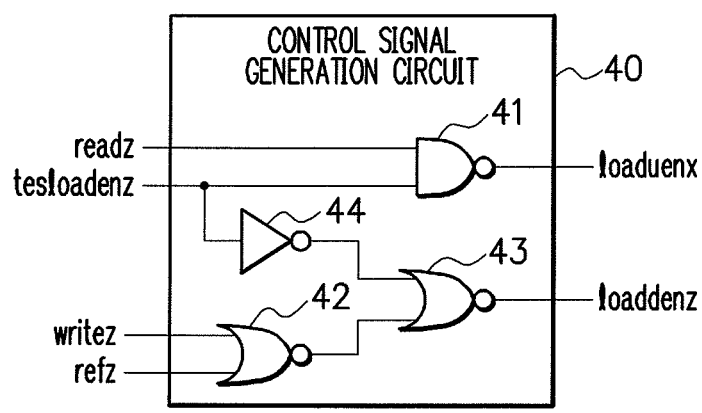
FIG. 4 is a view that illustrates a configuration example of a control signal generation circuit according to the present embodiment.

FIG. 4 is a view that illustrates a configuration example of a control signal generation circuit that generates the signal loaduenx and the signal loaddenz. A control signal generation circuit 40 illustrated in FIG. 4 generates the signal loaduenx and the signal loaddenz so as to actuate the voltage distribution control circuit 20 when testing the semiconductor memory device. The control signal generation circuit 40 includes a NAND gate (negative-AND operation circuit) 41, NOR gates (negative-OR operation circuits) 42 and 43, and an inverter 44.

A signal readz and a signal tesloadenz are input to the NAND gate 41, and the NAND gate 41 outputs the operation result as the signal loaduenx. A signal writez and a signal refz are input to the NOR gate 42, and the NOR gate 42 outputs the operation result. An inverted signal of the signal tesloadenz that has been inverted by the inverter 44 and the output of the NOR gate 42 are input to the NOR gate 43, and the NOR gate 43 outputs the operation result as the signal loaddenz. The signal readz is a signal that is activated at the time of a read operation. The signal writez is a signal that is activated at the time of a write operation. The signal refz is a signal that is activated at the time of a refresh operation. Further, the signal tesloadenz is a signal that is activated when testing. For example, when using the present embodiment for detection of memory cells or data transmission paths with poor characteristics at a time of pre-shipment testing, it is sufficient to connect a signal for testing that is controlled by a mode register or the like to the signal tesloadenz.

When the signal tesloadenz is "H" and the signal readz is "H", the signal loaduenx becomes "L". Other than the aforementioned case, the signal loaduenx is maintained at "H". Thus, the voltage vblh of the output node is set to the upper limit value at the time of a read operation when testing.

Further, when the signal tesloadenz is "H" and the signal writez is "H", the signal loaddenz becomes "H". In addition, when the signal tesloadenz is "H" and the signal refz is "H", the signal loaddenz becomes "H". Other than the aforementioned cases, the signal loaddenz is maintained at "L". Thus, the voltage vblh of the output node is set to the lower limit value at the time of a write operation and the time of a refresh operation when testing. In this connection, the reason the voltage vblh of the output node is set to the lower limit value at the time of a refresh operation when testing is that, in a refresh operation the components that are on an outer side of the sense amplifier are not driven and the read amplifier does not operate, and rewrite to the memory cells is performed.

Figure 5:
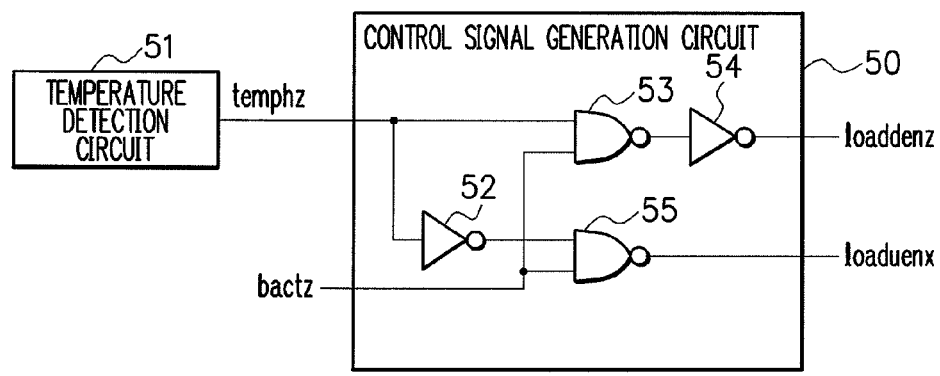
FIG. 5 is a view that illustrates another configuration example of a control signal generation circuit according to the present embodiment.

FIG. 5 is a view that illustrates another configuration example of a control signal generation circuit that generates the signal loaduenx and the signal loaddenz. A control signal generation circuit 50 illustrated in FIG. 5 controls the operation of the voltage distribution control circuit 20 in accordance with a temperature detection result in the semiconductor memory device. By controlling the operation of the voltage distribution control circuit 20 in accordance with a temperature detection result, it is also possible to utilize the present embodiment for uses other than pre-shipment testing. There are the following advantages to controlling the operation of the voltage distribution control circuit 20 in accordance with a temperature detection result. For example, since a standby current of a chip that a semiconductor memory device forms is large at a high temperature, even if the voltage distribution control circuit 20 is activated, the impact on current consumption is comparatively small. Further, for example, there is a strong correlation between retention characteristics of "H" data in a memory cell and temperature, and the influence of temperature on the data retention characteristics can be lessened.

The control signal generation circuit 50 has inverters 52 and 54, and NAND gates 53 and 55. A signal temphz and a signal bactz are input to the NAND gate 53, and the NAND gate 53 outputs the operation result as the signal loaddenz via the inverter 54. An inverted signal of the signal temphz that has been inverted by the inverter 52 and the signal bactz are input to the NAND gate 55, and the NAND gate 55 outputs the operation result as the signal loaduenx. The signal temphz is a signal that is output by the temperature detection circuit 51, and "H" is output at the time of a high temperature detection when the detected temperature is higher than a certain temperature. The signal bactz is an active signal of a bank that indicates whether the inside of the memory is in a standby state or an active state, and "H" is output when the inside of the memory is in an active state.

Accordingly, when the signal temphz is "L" and the signal bactz is "H", the signal loaduenx becomes "L". Other than the aforementioned case, the signal loaduenx is maintained at "H". Thus, the voltage of the output node is set to the upper limit value at a time that a high temperature is not detected and the inside of the memory is in an active state. Further, when the signal temphz is "H" and the signal bactz is "H", the signal loaddenz becomes "H". Other than the aforementioned case, the signal loaddenz is maintained at "L". Thus, the voltage of the output node is set to the lower limit value at a time that a high temperature is detected and the inside of the memory is in an active state. Note that, when the signal bactz is "L", the signal loaddenz is "L" and the signal loaduenx is "H".

Accordingly, when the inside of the memory is in a standby state, the current consumption is reduced.

For example, an initialization voltage vble of a bit line is available as an internal voltage of a semiconductor memory device to which this control is favorably applied. In the memory core illustrated in FIG. 15, with the fact that data stored in a memory cell is lost over time as one factor, there are cases in which a minute current flows to a back bias vbb through a PN junction from a source/drain portion of a cell transistor, and it is known that data is liable to be lost particularly at a time of a high temperature when "H" data is retained in memory cells.

When applying the control signal generation circuit 50 illustrated in FIG. 5, the voltage vble can be set to a low value by making the signal loaddenz "H" when reading data from a memory cell at a time that a high temperature is detected. At this time, since it is recognized that "H" data is stored if a voltage value that is higher than the voltage vble that is set to a low value is stored in the memory cell, performance of a normal read operation is facilitated even if a charge in the memory cell decreases. Conversely, in the case of reading data from a memory cell at a low temperature, the voltage vble is set to a high value by making the signal loaduenx "L". Thus, since the state of the voltage vble becomes the opposite to that at the time of a high temperature, it is possible to supply a voltage vble that is suitable for the "H" data retention characteristics of a memory cell at a high temperature and at a low temperature.

Data that is read out to a bit line in the memory core illustrated in FIG. 15 is amplified by the sense amplifier at a time that a word line is activated. Therefore, in the control signal generation circuit 50, activation control of the signals loaduenx and loaddenz is performed with the signal bactz for which "H" is output when a row control circuit has been activated, and not with the signal readz that is activated when reading data.

Further, a modification is also possible that is configured so as to eliminate circuits relating to generation of the signal loaduenx and not to use the signal bactz in the control signal generation circuit 50 in order to utilize the control signal generation circuit 50 only at the time of a high temperature. In this case, an increase in current consumption can be suppressed by performing conventional generation of the voltage vble with respect to a low temperature at which the data retention period is comparatively long. Since the current consumption of the overall chip increases at a high temperature at which the data retention period is short, the retention characteristics of "H" data are improved while allowing an increase in current consumption caused by control of the voltage vble according to the present embodiment. Since a refresh cycle can be lengthened by the retention characteristics of "H" data being improved indirectly, and an effect of reducing current consumption can also be obtained, depending on the adjustment, it is also possible to reduce the current consumption at a high temperature in terms of the overall chip. Further, although a method that controls the voltage vble has been exemplified here, the present embodiment may also be applied to control that sets the voltage vblh to a high value at a time of a high temperature.

Figure 6:
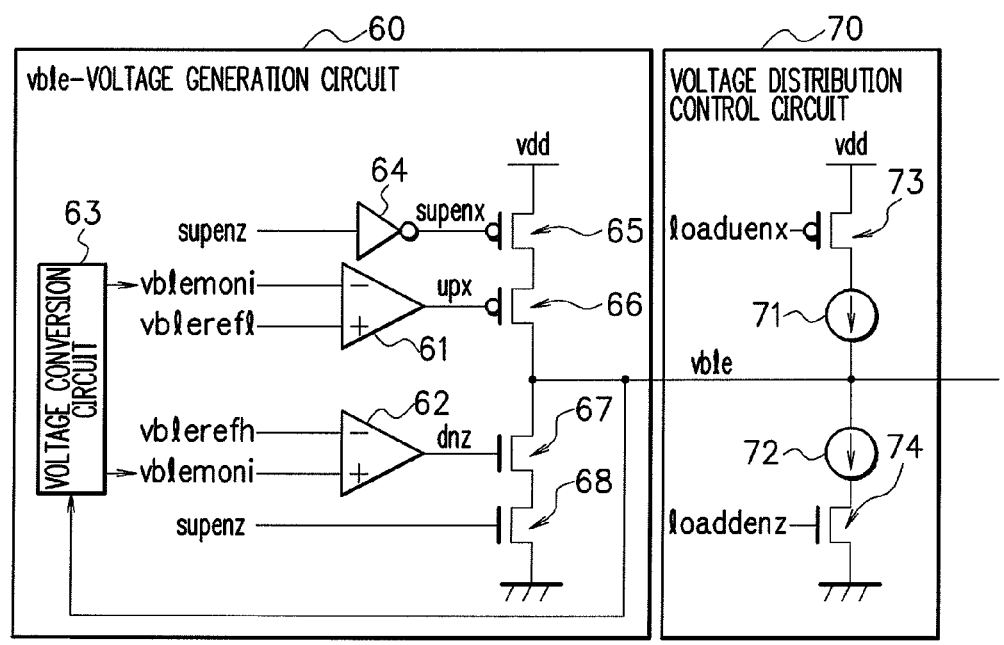
FIG. 6 is a view that illustrates a configuration example of a vble voltage generation circuit and a voltage distribution control circuit according to the present embodiment.

FIG. 6 is a view that illustrates a configuration example of a vble voltage generation circuit and a voltage distribution control circuit for controlling the voltage vble as described above. The respective components denoted by reference numerals 60 to 68 and 70 to 74 illustrated in FIG. 6 correspond to the respective components denoted by reference numerals 10 to 18 and 20 to 24 illustrated in FIG. 1, and the operations and connection relationships and the like thereof are the same as in the configuration illustrated in FIG. 1. However, the configuration illustrated in FIG. 6 differs from the configuration illustrated in FIG. 1 in that the upper limit value of a detection voltage is vblerefh and the lower limit value is vblerefl, and the voltage of an output node is vble.

Figure 7:
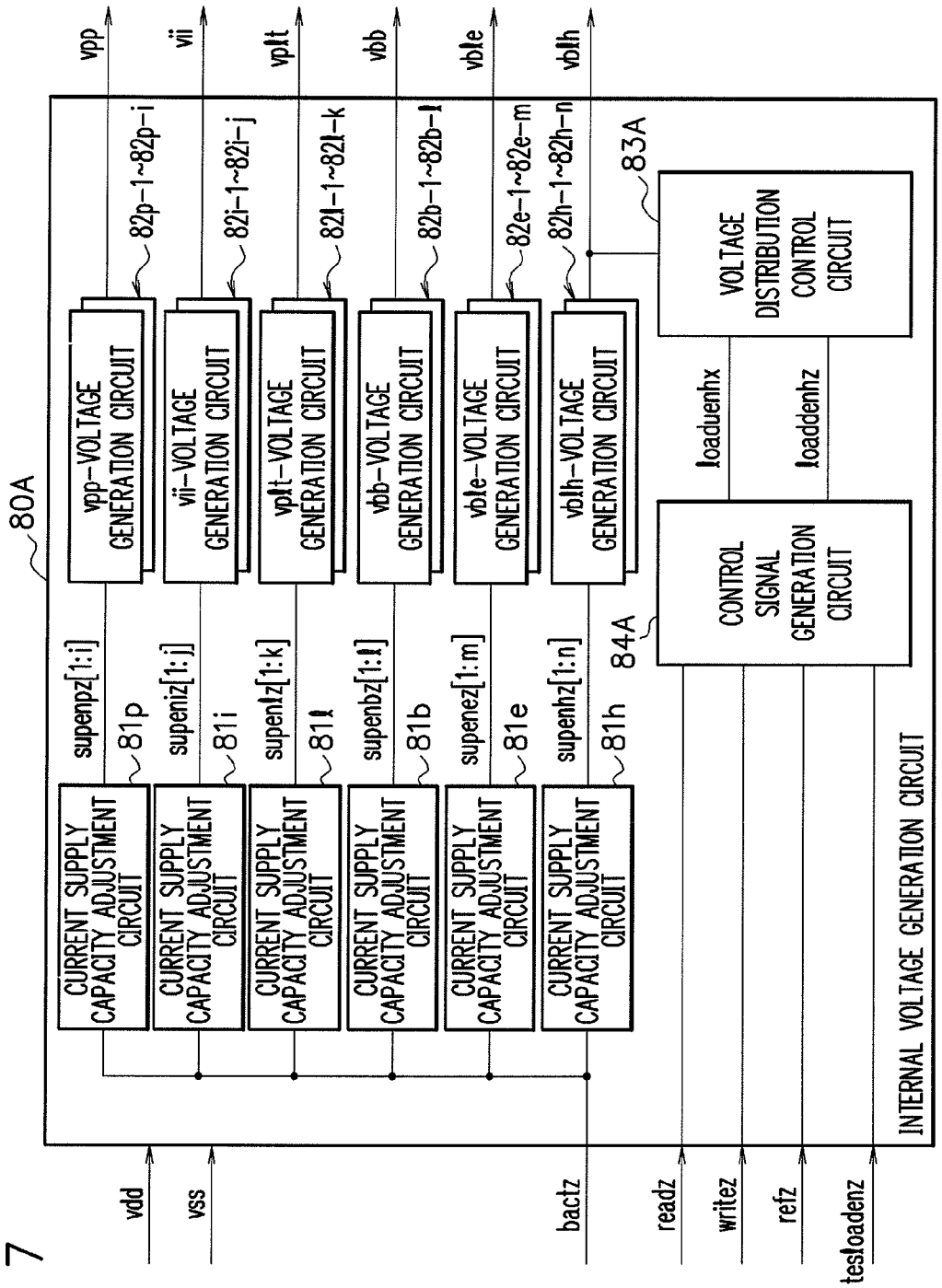
FIG. 7 is a view that illustrates a configuration example of an internal voltage generation circuit according to the present embodiment.

FIG. 7 is a view that illustrates a configuration example of an internal voltage generation circuit for generating the respective voltages that are supplied to the memory core illustrated in FIG. 15 and the like. In FIG. 7, a voltage vdd is a high-voltage power supply that is supplied from outside the internal voltage generation circuit 80A, and a voltage vss is a low-voltage power supply (for example, reference potential) that is supplied from outside the internal voltage generation circuit 80A. A signal bactz is a signal that becomes "H" when a row signal of the memory core is activated by an active command. The signals readz, writez, refz, and tesloadenz correspond to the signals readz, writez, refz, and tesloadenz illustrated in FIG. 4, respectively.

A voltage vpp is a voltage for activating a word line w/z. A voltage vii is a voltage for controlling various logic circuits. A voltage vplt is a voltage that is supplied to a memory cell capacitor. A voltage vbb is a back bias voltage of a memory cell transistor or the like. A voltage vble is an initialization voltage of a bit line. A voltage vblh is a voltage that corresponds to "H" information that is stored in the memory cell capacitor. A voltage distribution control circuit 83A corresponds to the voltage distribution control circuit 20 illustrated in FIG. 1. A control signal generation circuit 84A corresponds to the control signal generation circuit 40 illustrated in FIG. 4.

In this case, the current consumption of various power supplies is large during a period from when a row signal of the memory core is activated until the later of a time that the row signal is inactivated and a time that data is output to a terminal. Consequently, to increase a current supply capacity taking the signal bactz as a trigger, a signal supenz is controlled by current supply capacity adjustment circuits 81 that correspond to the various power supplies, and the number of voltage generation circuits that are activated and the like is controlled with respect to voltage generation circuits 82 of various power supplies, for each of which a plurality of voltage generation circuits are provided. Adjustment of the current supply capacity can be realized for the various power supplies by performing control in this manner. By also providing the voltage distribution control circuit 83A and performing control of the voltage vblh, the voltage vblh can be appropriately controlled in an accurate manner in accordance with the operating state and the like.

Figure 8:
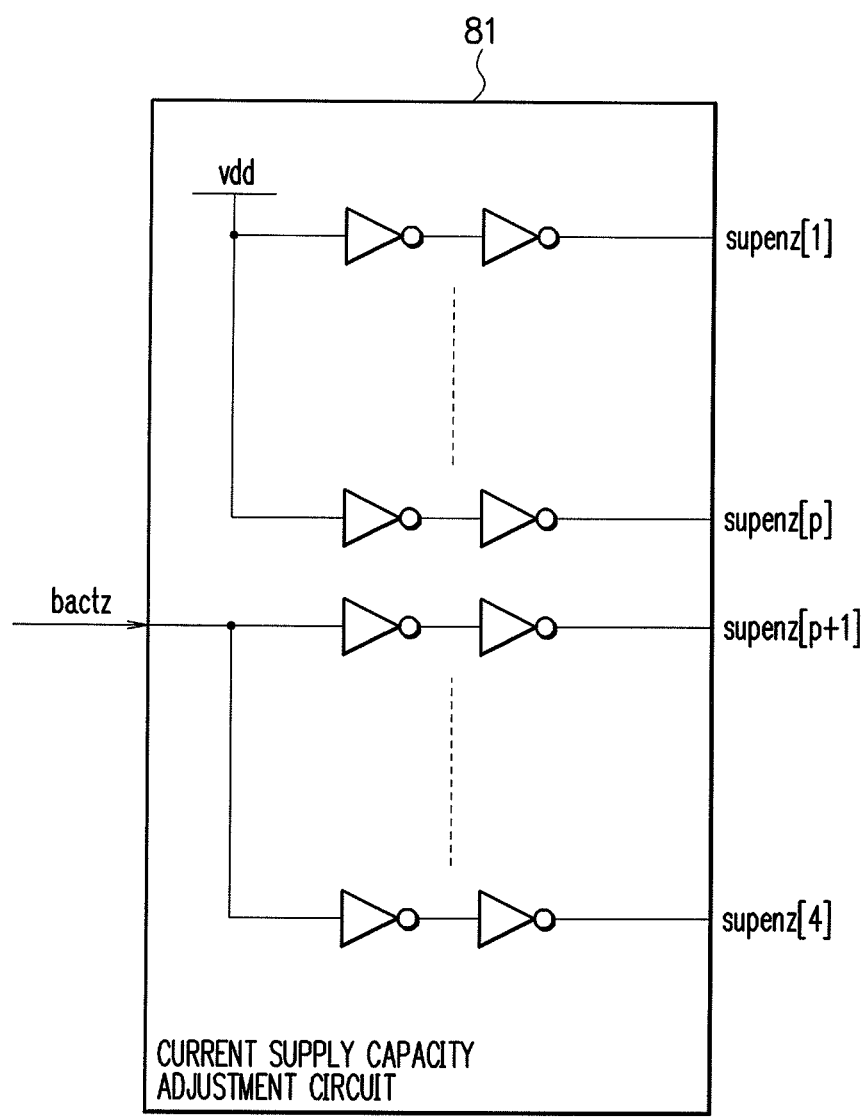
FIG. 8 is a view that illustrates a configuration example of a voltage supply capacity adjustment circuit according to the present embodiment.

For example, each of the current supply capacity adjustment circuits 81 that are disposed in correspondence with the various power supplies are configured so that, among q number of output signals supenz illustrated in FIG. 8, p signals that include signal supenz [1] to supenz [p] always output "H". Further, with respect to signals supenz [p+1] to supenz [q], a signal bactz is received that becomes "H" at an active time, and the signals supenz [p+1] to supenz [q] output the same logic level as the signal bactz. By adopting this configuration, the current supply capacity at an active time can be set to a multiple of (q/p) of the current supply capacity at standby (an inactive time). Note that the method for adjusting the current supply capacity that is described with reference to FIG. 8 is one example, and the present embodiment is not limited thereto.

Figure 9:
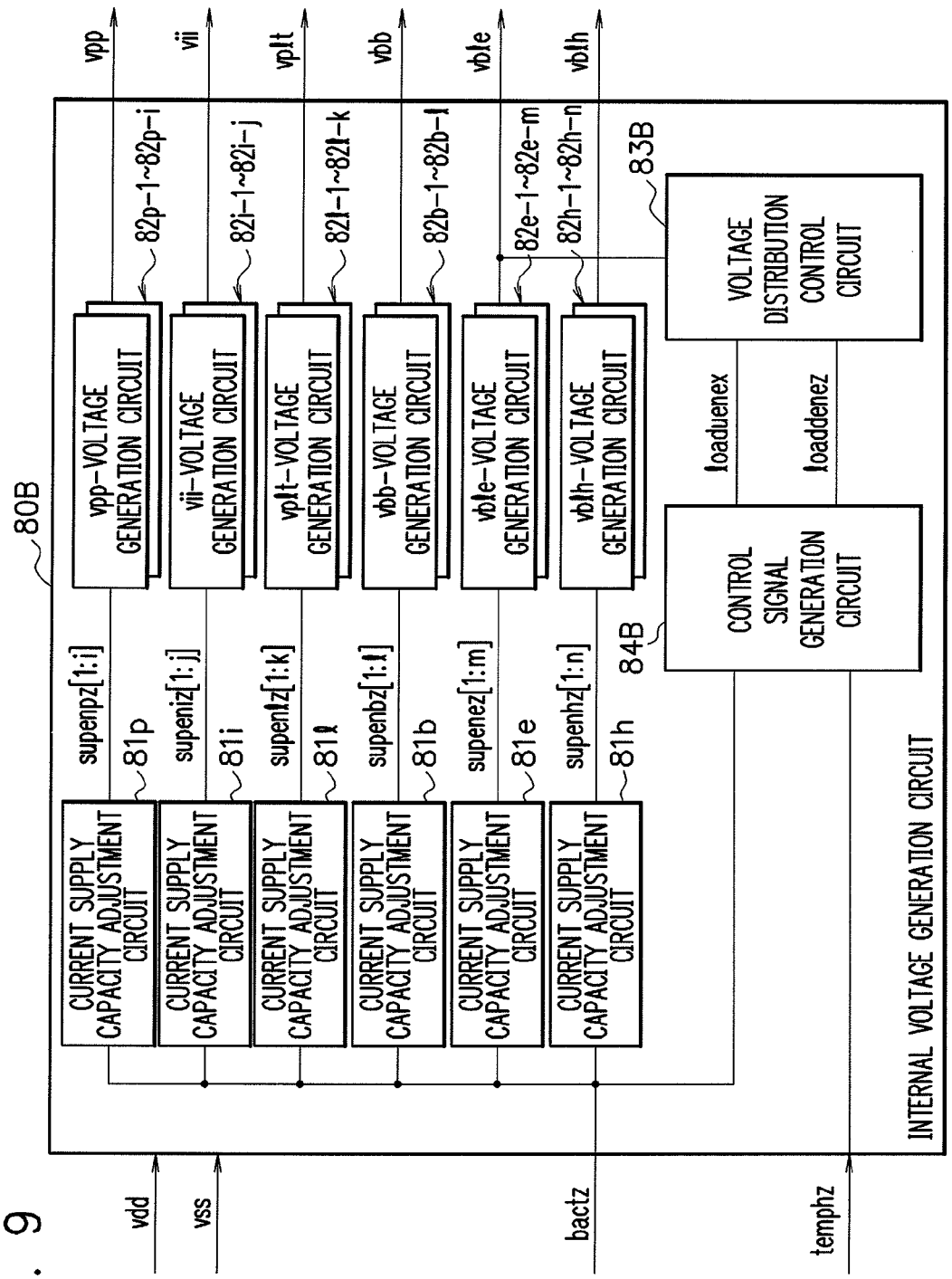
FIG. 9 is a view that illustrates a configuration example of an internal voltage generation circuit according to the present embodiment.

FIG. 9 is a view that illustrates another configuration example of an internal voltage generation circuit for generating respective voltages to be supplied to the memory core illustrated in FIG. 15 and the like. In an internal voltage generation circuit 80B illustrated in FIG. 9, blocks that are the same as in the internal voltage generation circuit 80A illustrated in FIG. 7 are denoted by the same reference characters. A signal temphz corresponds to the signal temphz illustrated in FIG. 5. A voltage distribution control circuit 83B corresponds to the voltage distribution control circuit 70 illustrated in FIG. 6, and a control signal generation circuit 84B corresponds to the control signal generation circuit 50 illustrated in FIG. 5. The internal voltage generation circuit 80B illustrated in FIG. 9 is configured to perform control of the voltage vble, and by proving the voltage distribution control circuit 83B, it is possible to appropriately control the voltage vble in an accurate manner in accordance with the operating state and the like.

Note that the configurations illustrated in FIG. 7 and FIG. 9 may be combined to perform control of the voltage vblh, and may also be configured to perform control of the voltage vble.

Figure 10:
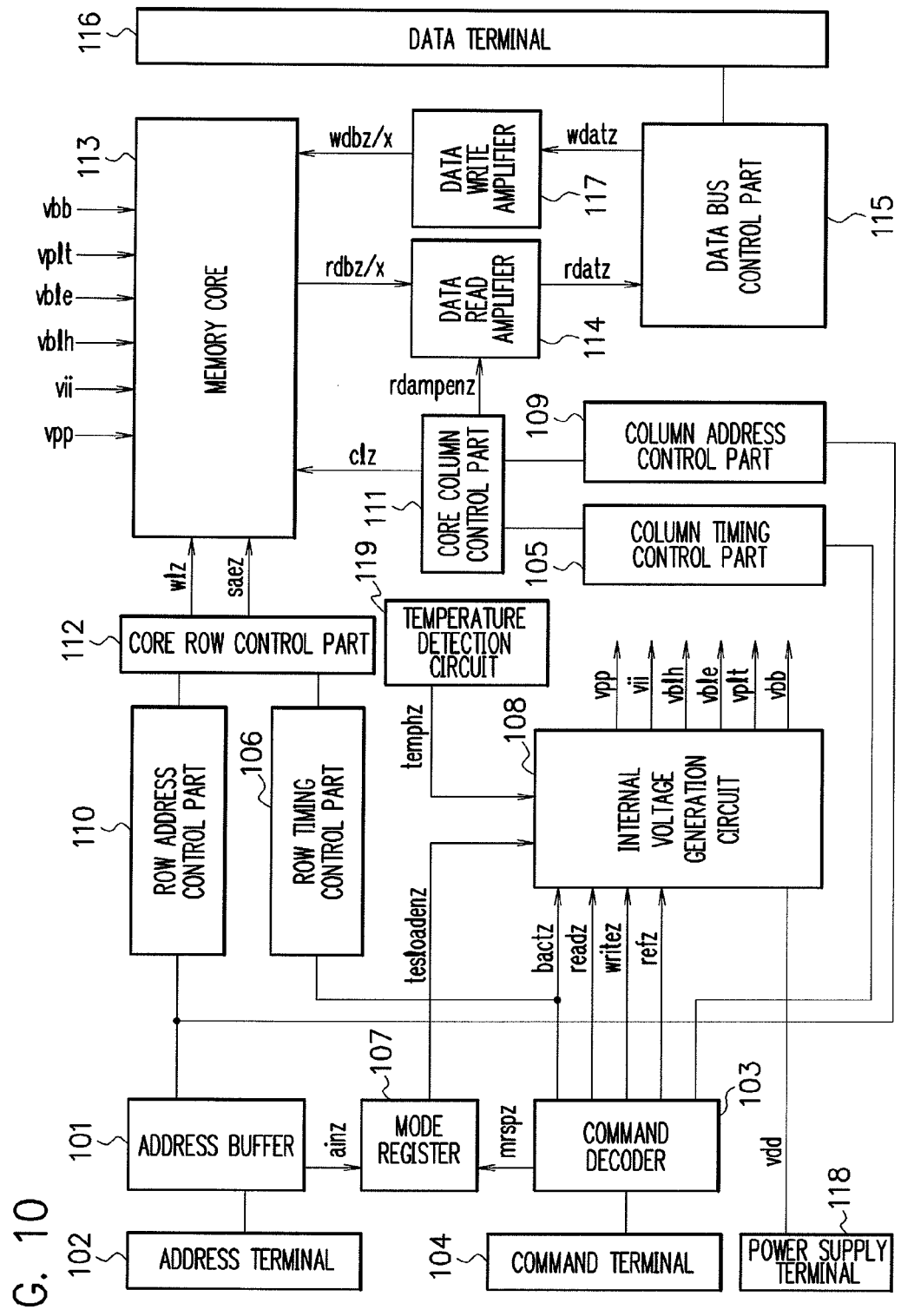
FIG. 10 is a view that illustrates a configuration example of a semiconductor memory device according to the present embodiment.

FIG. 10 is a view that illustrates a configuration example of a semiconductor memory device to which an internal voltage generation circuit according to the present embodiment is applied. Note that in FIG. 10, to facilitate the description, the signal names employed in the foregoing description are described with respect to signal lines through which signals are exchanged in each circuit portion. Further, in FIG. 10, a case is exemplified in which the signal tesloadenz is implemented as a function of a mode register.

An address buffer 101 receives an address signal that is input via an address terminal 102. A command decoder 103 receives a command signal that is input via a command terminal 104. The command decoder 103 decodes the received command signal, and generates various kinds of signals such as a control signal based on the decoding result. The various kinds of signals that are generated by the command decoder 103 are supplied to a column timing control part 105, a row timing control part 106, a mode register 107, and an internal voltage generation circuit 108. For example, the command decoder 103 supplies a signal mrspz that designates the setting of the operation mode, such as a test mode, to the mode register 107.

A column address control part 109 receives a bank address and a column address from the address buffer 101. A row address control part 110 receives a bank address and a row address from the address buffer 101. A core column control part 111 receives signals from the column timing control part 105 and the column address control part 109, and controls a signal clz to execute a column selection or the like. A core row control part 112 receives signals from the row timing control part 106 and the row address control part 110, and controls a word line w/z and a signal saez to execute a word selection or the like.

A memory core 113 corresponds, for example, to the memory core illustrated in FIG. 15. In this connection, the memory core illustrated in FIG. 15 includes a large number of memory cells that are disposed in an array shape that are a part of the memory core, and a plurality of sense amplifiers. Data that is read from memory cells inside the memory core 113 is amplified by a data read amplifier 114, and thereafter is output through a data terminal 116 by a data bus control part 115. Further, data that is written into a memory cell inside the memory core 113 is input into the data bus control part 115 through the data terminal 116, and supplied to the memory core 113 by a data write amplifier 117.

The internal voltage generation circuit 108 generates various kinds of internal voltages that are used in the semiconductor memory device based on a power supply voltage vdd that is supplied via a power supply terminal 118. The internal voltage generation circuit 108 has a function that controls the internal voltage in accordance with various signals from the command decoder 103 or a signal from a temperature detection circuit 119. For example, as described above, the internal voltage generation circuit 108 can set the voltage vblh to a voltage corresponding to an upper limit of a detection voltage or to a voltage corresponding to a lower limit of a detection voltage. Further, for example, the internal voltage generation circuit 108 can set the voltage vble to a voltage corresponding to an upper limit of a detection voltage or to a voltage corresponding to a lower limit of a detection voltage in the manner described above. Note that, although the temperature detection circuit 119 is provided in the example illustrated in FIG. 10, the temperature detection circuit 119 is not essential, and a configuration may be adopted that includes the temperature detection circuit 119 according to necessity.

Figure 11:
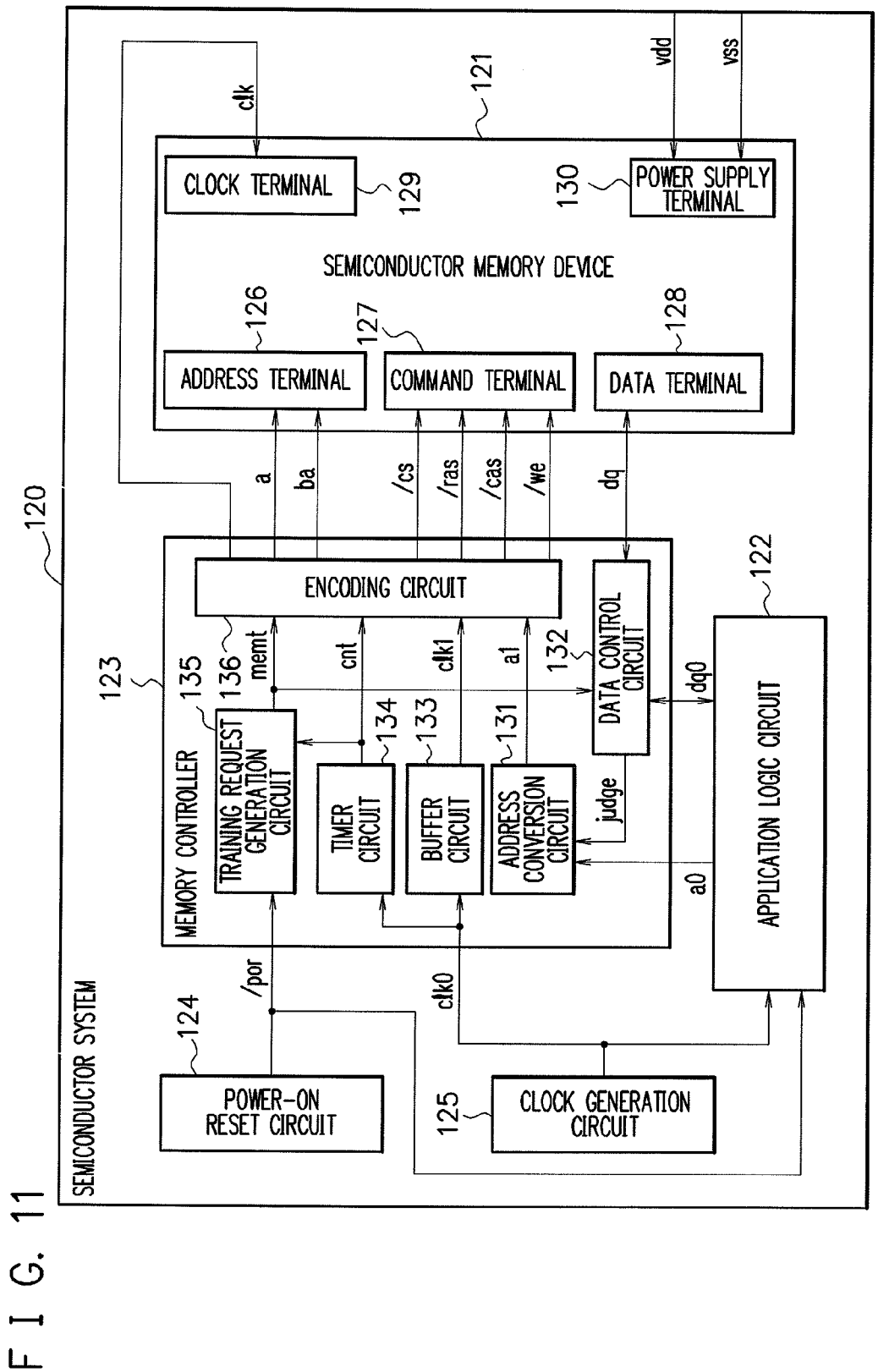
FIG. 11 is a view that illustrates a configuration example of a system having the semiconductor memory device according to the present embodiment.

FIG. 11 is a view that illustrates a configuration example of a system in which the semiconductor memory device is mounted according to the present embodiment. A system 120 illustrated in FIG. 11 includes a semiconductor memory device 121, an application logic circuit 122, a memory controller 123, a power-on reset circuit 124, a clock generation circuit 125 and the like.

The semiconductor memory device 121, for example, corresponds to the semiconductor memory device illustrated in FIG. 10. The semiconductor memory device 121 is controlled by an address signal a and a bank address signal ba that are input through an address terminal 126, command signals /cs, /ras, /cas and /we that are input through a command terminal 127, a data signal dq that is input through a data terminal 128, and a clock clk that is input through a clock terminal 129. Further, voltages vdd and vss are supplied through a power supply terminal 130 to the semiconductor memory device 121. Note that the signal /cs is a chip select signal, the signal /ras is a row address strobe signal, the signal /cas is a column address strobe signal, and the signal /we is a write enable signal.

The memory controller 123 acts as an intermediary for the exchange of various signals and the like between the semiconductor memory device 121 and the application logic circuit 122. The memory controller 123 includes an address conversion circuit 131, a data control circuit 132, a buffer circuit 133, a timer circuit 134, a training request generation circuit 135, and an encoding circuit 136. When the memory controller 123 receives data dq0 designated by an address a0 from the application logic circuit 122, the address is converted to the address signal a and the bank address signal ba, the data is converted to a data signal dq, adjustment of the timing and the like is performed, and communication is carried out with the semiconductor memory device 121.

The power-on reset circuit 124 sets a power-on reset signal /por to "L" at power-on to perform initialization of each circuit. Further, a timer circuit 134 inside the memory controller 123 counts a clock clk0 that is generated at the clock generation circuit 125, and generates a signal cnt for performing a particular operation at regular intervals. For example, the signal cnt is used to generate a refresh request signal of the memory or a training signal.

The training request generation circuit 135 inside the memory controller 123 generates a training signal memt using the signal cnt that toggles periodically and the power-on reset signal /por that is generated at power-on. The training signal memt is a signal that is activated, for example, at power-on or when a training mode is set that performs correction by adjusting the operation timing or the like at a certain timing. The training signal memt instructs the encoding circuit 136 to generate a command signal and an address signal to send to the semiconductor memory device 121, and also instructs the data control circuit 132 to generate data for training. The data control circuit 132 sends a signal judge that is a pass/fail judgment result with respect to read data from the memory at a time of training to the address conversion circuit 131. The address conversion circuit 131 records an address conversion rule for replacing an address of a memory cell with poor characteristics that is detected when training based on the result of the signal judge in an electrically rewritable storage part (for example, a ROM), and performs address conversion so that a memory cell with poor characteristics is not used in operations thereafter.

In this case, by utilizing the semiconductor memory device of the present embodiment, a test of memory characteristics at voltage supply conditions in a worst state with respect to the usage environment can be performed by inducing the voltage vblh at a time of a write operation when training to the lower limit of a normal voltage generation range. Thus, the semiconductor memory device according to the present embodiment is useful for providing voltage generation means that is suited to the usage environment with respect to a system that performs training of a semiconductor memory device also.

Figure 12A:
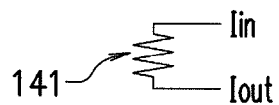
FIGS. 12A, 12B and 12C are views that illustrate an example of a current source.
Figure 12B:
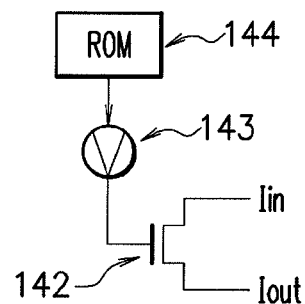
Figure 12C:
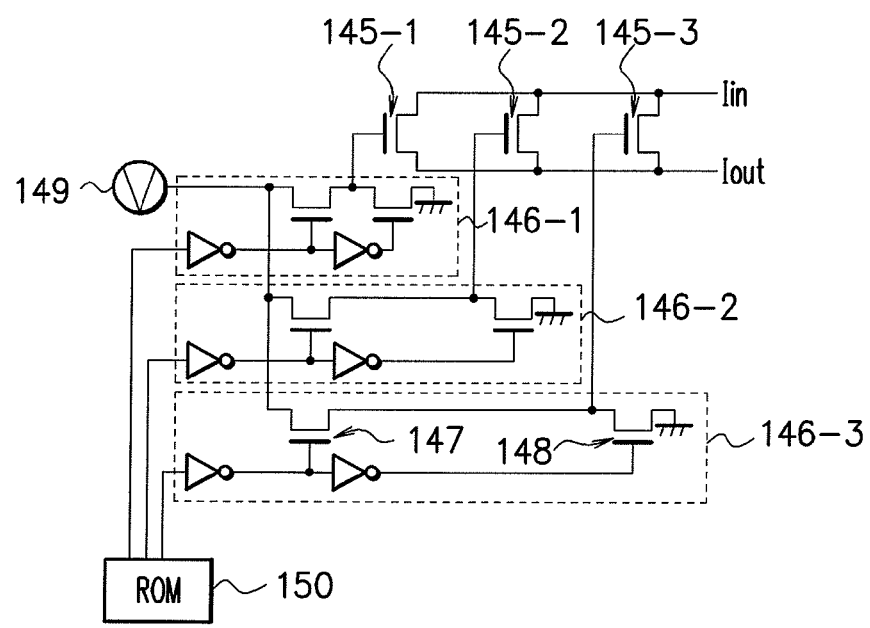

FIGS. 12A, 12B and 12C are views that illustrate configuration examples of a current source as a current load of the voltage distribution control circuits 20 and 70 and the like. FIG. 12A illustrates an example in which a current source as a current load is constituted by a resistance 141 that has one end connected to an input end Iin and the other end connected to an output end Iout.

FIG. 12B illustrates an example in which a current source as a current load is constituted by a transistor 142, a power supply 143, and a storage part 144. A main electrode of the transistor 142 is connected to the input end Iin and the output end Iout. A certain voltage is supplied to a control electrode of the transistor 142 from the power supply 143. The certain voltage that is supplied to the control electrode of the transistor 142 from the power supply 143 is controlled based on data obtained by a test process or the like and stored in advance in the storage part 144. By supplying the certain voltage to the control electrode of the transistor whose main electrode is connected to the input end Iin and output end Iout in this manner, a current source as a current load can be realized.

FIG. 12C illustrates another configuration example of a current source as a current load. In the configuration illustrated in FIG. 12C, a main electrode of a transistor 145-$i$ ("i" denotes a natural number) is connected to the input end Iin and output end Iout, and the output of a control circuit 146-$i$ is supplied to a control electrode of the transistor 145-$i$. Data relating to current control that is obtained by a test process or the like is stored in advance in a storage part 150, and one of transistors 147 and 148 is placed in an "on" state in each control circuit 146-$i$ based on the data. Thus, a current source as a current load can be realized by each control circuit 146-$i$ respectively controlling whether to supply a certain voltage in accordance with a voltage source 149 to a gate of the corresponding transistor 145-$i$ or to supply the voltage vss.

Figure 13:
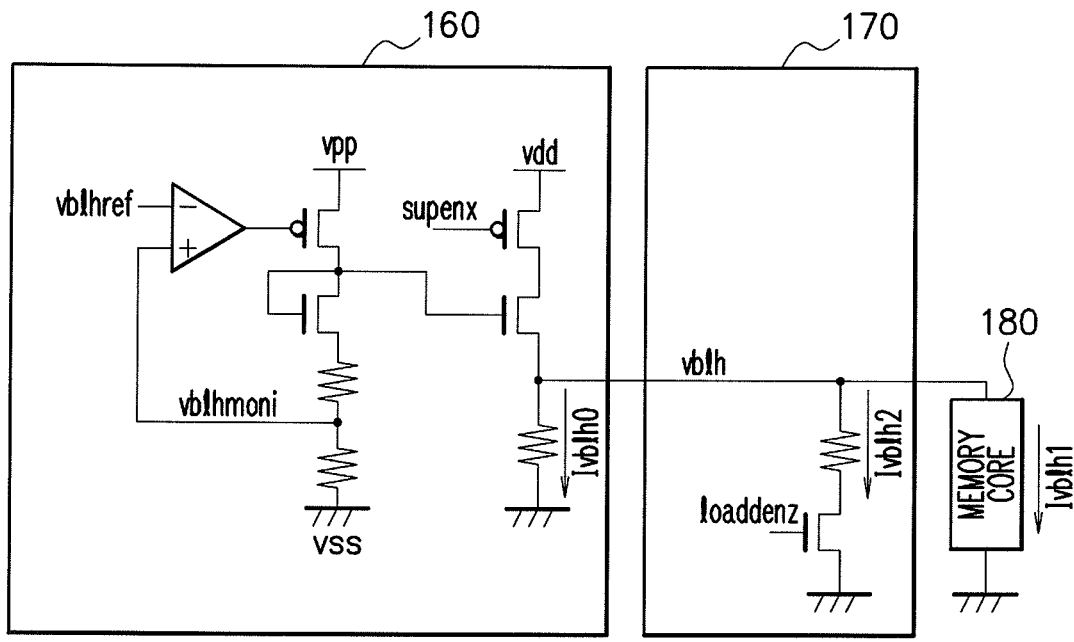
FIG. 13 is a view that illustrates another configuration example of a vblh voltage generation circuit and a voltage distribution control circuit according to the present embodiment.

FIG. 13 illustrates an example of a vblh voltage generation circuit that is different to the vblh voltage generation circuit illustrated in FIG. 16A, and that is configured to perform control of the voltage vblh in the same manner as the present embodiment. In FIG. 13, reference numeral 160 denotes a vblh voltage generation circuit, reference numeral 170 denotes a voltage distribution control circuit, and reference numeral 180 denotes a memory core. The vblh voltage generation circuit 160 is a feed-forward type voltage generation circuit. In the vblh voltage generation circuit 160, one output transistor has a non-linear current supply capacity and another transistor (in the example illustrated in FIG. 13, on a side that pulls down the output node of the voltage vblh) functions as a current load. For example, according to the circuit illustrated in FIG. 13, since generation of the voltage vblh to a high level is suppressed, the circuit can be utilized to stably detect memory cells with poor memory cell write characteristics.

Figure 14:
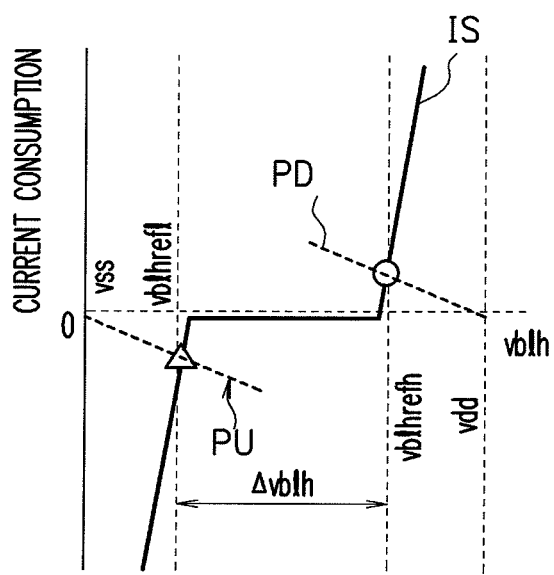
FIG. 14 is a view that illustrates an example of a current and a voltage vblh of the vblh voltage generation circuit according to the present embodiment.

FIG. 14 is a view that illustrates current consumption and an output voltage vblh of the vblh voltage generation circuit according to the present embodiment. In FIG. 14, reference character IS denotes a current supply characteristic of the vblh voltage generation circuit in a state in which the voltage distribution control circuit is not actuated, reference character PD denotes a current load line of a current load on a pull-down side, and reference character PU denotes a current load line of a current load on a pull-up side. A variation in the output voltage vblh of the vblh voltage generation circuit in a state in which the voltage distribution control circuit is not actuated is taken as $\Delta$vblh. According to the present embodiment, by activating the current load on the pull-down side of the voltage distribution control circuit, the output voltage vblh is set to a voltage that corresponds to a point of intersection between the current supply characteristic IS and the current load line PD. Further, by activating the current load on the pull-up side of the voltage distribution control circuit, the output voltage vblh is set to a voltage that corresponds to a point of intersection between the current supply characteristic IS and the current load line PU. Thus, according to the present embodiment, the voltage vblh can be accurately controlled.

The internal voltage generation circuit of a semiconductor memory device described in the foregoing can accurately control an internal voltage that is generated.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An internal voltage generation circuit of a semiconductor memory device to which a first power supply voltage is supplied, comprising:
a voltage generation circuit that generates a second power supply voltage based on the first power supply voltage, outputs the second power supply voltage to an output node, compares a value of a voltage of the output node and a detection voltage value, and controls the voltage of the output node so as to be a voltage between a first voltage corresponding to a lower limit of the detection voltage value and a second voltage corresponding to an upper limit of the detection voltage value; and
a voltage control circuit that includes:
a first current load circuit that is connected to the output node and that changes the voltage of the output node so as to pull down the voltage of the output node; and
a second current load circuit that is connected to the output node and that changes the voltage of the output node so as to pull up the voltage of the output node,
wherein the voltage of the output node is maintained at the first voltage by the first current load circuit of the voltage control circuit operating, and the voltage of the output node is maintained at the second voltage by the second current load circuit of the voltage control circuit operating.

2. The internal voltage generation circuit according to claim 1, wherein:
the first current load circuit is a first current source that is disposed between the output node and a first node to which a third power supply voltage lower than the first power supply voltage is supplied; and
the second current load circuit is a second current source that is disposed between the output node and a second node to which the first power supply voltage is supplied.

3. The internal voltage generation circuit according to claim 1, wherein operations of the first current load circuit and the second current load circuit are controlled in accordance with at least one of an operating state and an operating environment of the semiconductor memory device.

4. The internal voltage generation circuit according to claim 1, wherein at a time of at least one of an operation to write data and an operation to refresh data in the semiconductor memory device, the first current load circuit of the voltage control circuit is actuated.

5. The internal voltage generation circuit according to claim 1, wherein at a time of an operation to read data in the semiconductor memory device, the second current load circuit of the voltage control circuit is actuated.

6. The internal voltage generation circuit according to claim 1, wherein operations of the first current load circuit and the second current load circuit are controlled in accordance with a detection result at a temperature detection circuit that the semiconductor memory device includes.

7. The internal voltage generation circuit according to claim 1, wherein when testing the semiconductor memory device, control is performed that maintains the voltage of the output node at the first voltage by the first current load circuit of the voltage control circuit operating, or control is performed that maintains the voltage of the output node at the second voltage by the second current load circuit of the voltage control circuit operating.

8. The internal voltage generation circuit according to claim 1, wherein the second power supply voltage is a voltage that is used when writing data of a high level to a memory cell of the semiconductor memory device.

9. The internal voltage generation circuit according to claim 1, wherein the second power supply voltage is an initialization voltage of a bit line of the semiconductor memory device.

10. The internal voltage generation circuit according to claim 2, wherein the voltage generation circuit includes:
a first driver that pulls down an output voltage to the output node;
a second driver that pulls up an output voltage to the output node;
a first drive circuit that drives the first driver in accordance with a result of a comparison between the value of the voltage of the output node and the upper limit of the detection voltage value; and
a second drive circuit that drives the second driver in accordance with a result of a comparison between the value of the voltage of the output node and the lower limit of the detection voltage value.

11. The internal voltage generation circuit according to claim 10, wherein the voltage generation circuit further includes:
a current supply control circuit that controls a current supply to the first driver and the second driver.

12. A semiconductor memory device, comprising:
a memory core including a plurality of memory cells;
an access control circuit that receives a command signal and an address signal, and executes an access in accordance with the command signal to a memory cell inside the memory core that is designated by the address signal; and
an internal voltage generation circuit to which a first power supply voltage is supplied and which generates and outputs an internal voltage that is supplied to the memory core,
wherein the internal voltage generation circuit includes:
a voltage generation circuit that generates a second power supply voltage based on the first power supply voltage, outputs the second power supply voltage to an output node, compares a value of a voltage of the output node and a detection voltage value, and controls the voltage of the output node so as to be a voltage between a first voltage corresponding to a lower limit of the detection voltage value and a second voltage corresponding to an upper limit of the detection voltage value; and
a voltage control circuit including:
a first current load circuit that is connected to the output node and that changes the voltage of the output node so as to pull down the voltage of the output node; and
a second current load circuit that is connected to the output node and that changes the voltage of the output node so as pull up the voltage of the output node,
wherein the voltage of the output node is maintained at the first voltage by the first current load circuit of the voltage control circuit operating, and the voltage of the output node is maintained at the second voltage by the second current load circuit of the voltage control circuit operating.

13. A semiconductor system, comprising:
a semiconductor memory device including:
a memory core including a plurality of memory cells;
an access control circuit that executes an access with respect to a memory cell inside the memory core in accordance with a command signal and an address signal that are received; and
an internal voltage generation circuit to which a first power supply voltage is supplied and which generates and outputs an internal voltage that is supplied to the memory core;
a first circuit that requests access to the semiconductor memory device; and
a memory controller that controls sending and receiving of signals between the semiconductor memory device and the first circuit,
wherein the internal voltage generation circuit of the semiconductor memory device includes:
a voltage generation circuit that generates a second power supply voltage based on the first power supply voltage, outputs the second power supply voltage to an output node, compares a value of a voltage of the output node and a detection voltage value, and controls the voltage of the output node so as to be a voltage between a first voltage corresponding to a lower limit of the detection voltage value and a second voltage corresponding to an upper limit of the detection voltage value; and
a voltage control circuit including:
a first current load circuit that is connected to the output node and that changes the voltage of the output node so as to pull down the voltage of the output node; and a second current load circuit that is connected to the output node and that changes the voltage of the output node so as to pull up the voltage of the output node, wherein the voltage of the output node is maintained at the first voltage by the first current load circuit of the voltage control circuit operating, and the voltage of the output node is maintained at the second voltage by the second current load circuit of the voltage control circuit operating.

14. The semiconductor system according to claim 13, wherein:

when a training mode is set, the semiconductor memory device performs control that maintains the voltage of the output node at the first voltage by the first current load circuit of the voltage control circuit operating, or performs control that maintains the voltage of the output node at the second voltage by the second current load circuit of the voltage control circuit operating.

15. The semiconductor system according to claim 14, wherein:

when the training mode is set, detection of defective memory cells that do not meet a use performance requirement is performed, and addresses of defective memory cells that are detected are retained; and at a time of normal operation, address conversion is performed that causes addresses of defective memory cells to correspond to other memory cells.

\* \* \* \* \*